(12) United States Patent
Shenoy

(10) Patent No.: US 11,688,770 B2
(45) Date of Patent: Jun. 27, 2023

(54) METHOD OF INCREASING FORWARD BIASED SAFE OPERATING AREA USING DIFFERENT THRESHOLD VOLTAGE SEGMENTS

(71) Applicant: Infineon Technologies Americas Corp., El Segundo, CA (US)

(72) Inventor: Praveen Shenoy, Chandler, AZ (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 17/457,161

(22) Filed: Dec. 1, 2021

(65) Prior Publication Data
US 2022/0085165 A1 Mar. 17, 2022

Related U.S. Application Data

(62) Division of application No. 16/573,376, filed on Sep. 17, 2019, now Pat. No. 11,217,666.

(51) Int. Cl.
H01L 29/08 (2006.01)
H01L 29/06 (2006.01)
H01L 29/10 (2006.01)
H01L 29/423 (2006.01)
H01L 21/266 (2006.01)

(52) U.S. Cl.
CPC ...... *H01L 29/0847* (2013.01); *H01L 29/0696* (2013.01); *H01L 29/1033* (2013.01); *H01L 29/42368* (2013.01); *H01L 21/266* (2013.01)

(58) Field of Classification Search
CPC ............. H01L 29/0847; H01L 29/0696; H01L 29/1033; H01L 29/42368; H01L 21/266
See application file for complete search history.

(56) References Cited

U.S. PATENT DOCUMENTS

| 8,436,367 B1 * | 5/2013 | Sdrulla | H01L 29/1095 257/341 |
| 10,833,671 B2 | 11/2020 | Shenoy | |
| 2003/0034522 A1 * | 2/2003 | Klodzinski | H01L 29/7395 257/E29.066 |
| 2005/0173757 A1 | 8/2005 | Peake | |
| 2006/0124996 A1 * | 6/2006 | Mizokuchi | H01L 29/7808 257/E29.066 |

(Continued)

FOREIGN PATENT DOCUMENTS

| EP | 0405138 A2 | 1/1991 |
| EP | 0772241 A1 | 5/1997 |

OTHER PUBLICATIONS

Hu, Chenming, et al., "Optimum Design of Power MOSFET's," IEEE Transactions on Electron Devices, vol. ED-31, No. 12, Dec. 1984, pp. 1693-1700.

*Primary Examiner* — Marc Anthony Armand
(74) *Attorney, Agent, or Firm* — Slater Matsil, LLP

(57) ABSTRACT

A method for increasing a forward biased safe operating area of a device includes forming a gate; and forming a segmented source close to the gate, wherein the segmented source includes first segments associated with a first threshold voltage and second segments associated with a second threshold voltage different from the first threshold voltage, wherein at least one device characteristic associated with the first segments is different from the same device characteristic associated with the second segments.

17 Claims, 25 Drawing Sheets

(56) References Cited

U.S. PATENT DOCUMENTS

2007/0205442 A1    9/2007  Torii  
2011/0241123 A1*  10/2011  Li ................... H01L 21/823437  
                                                257/E27.06  
2016/0163854 A1    6/2016  Nishimura

* cited by examiner

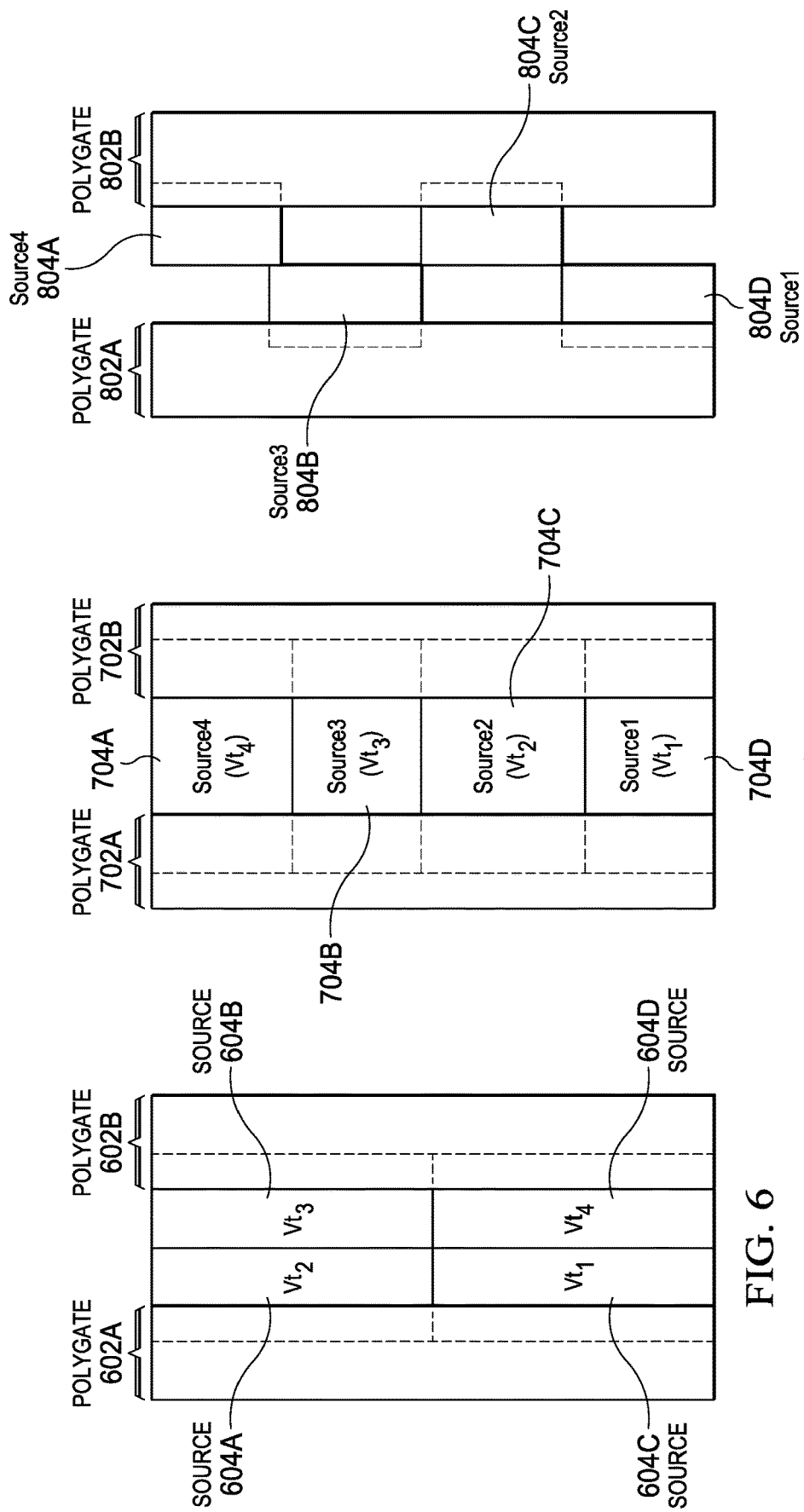

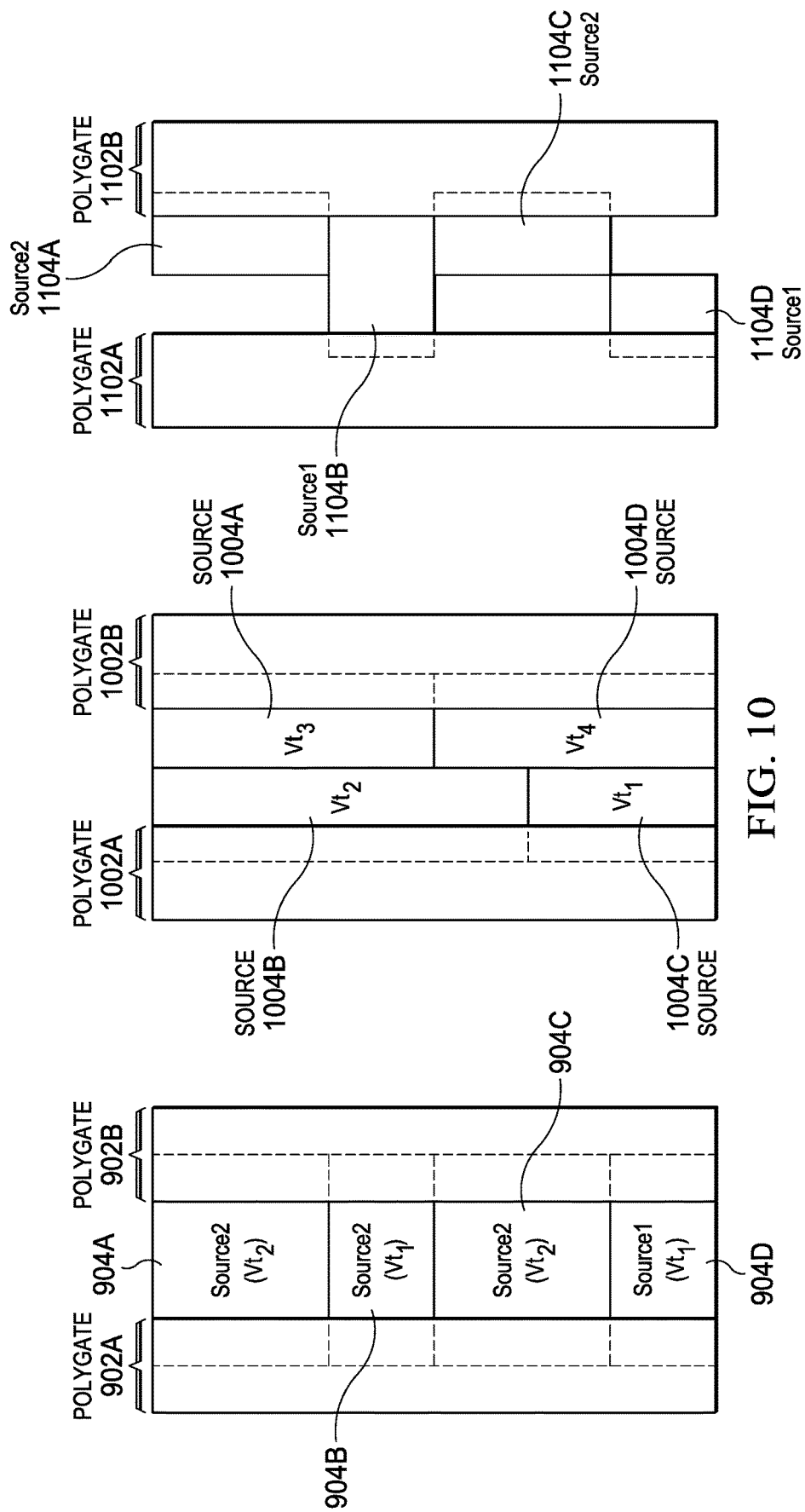

| WELL AND CELL GEOMETRIES | LINEAR CELL | SQUARE WELL IN SQUARE CELL | CIRCLE IN SQUARE CELL | HEXAGON IN SQUARE CELL | SQUARE IN HEXAGONAL CELL | CIRCLE IN HEXAGONAL CELL | HEXAGON IN HEXAGONAL CELL |
|---|---|---|---|---|---|---|---|
| | 1402 | 1404 | 1406 | 1408 | 1410 | 1412 | 1414 |
| UNIT CELL | | | | | | | |

FIG. 14

| DESIGN | $Vt_1$ | $Vt_2$ | ΔVt | Tm divg | $R_{DS(on)}$ |
|---|---|---|---|---|---|
| | V | V | V | C | mOhm |
| CONVENTIONAL | 3.53 | 3.53 | 0.00 | 20.6 | 31.7 |
| 50% Gm | 3.62 | 3.62 | 0.00 | 10.9 | 43.0 |
| DUAL Vt (50% LOW ΔVt) | 3.45 | 3.79 | 0.34 | 16.7 | 32.2 |
| DUAL Vt (50% HIGH ΔVt) | 3.43 | 4.02 | 0.59 | 11.2 | 33.2 |

| DESIGN | $R_{DS(on)}$ | SOA ID RANGE | SOA Avg_Id | % INCREASE |
|---|---|---|---|---|
| | mOhm | A | A | |
| CONVENTIONAL | 48 | 2.7-3.3 | 2.92 | |
| DUAL Vt STRIPE | 48 | 3.7-4.0 | 3.79 | 30% |

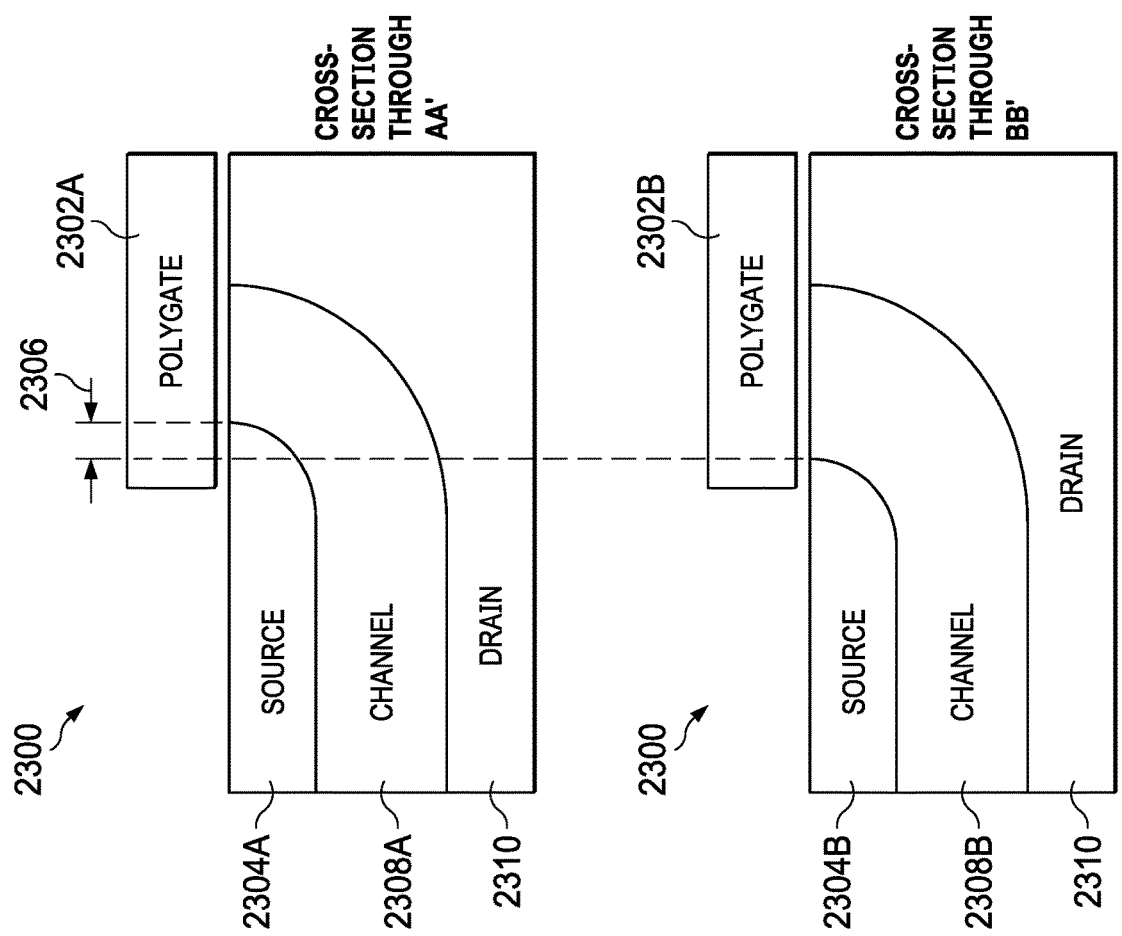
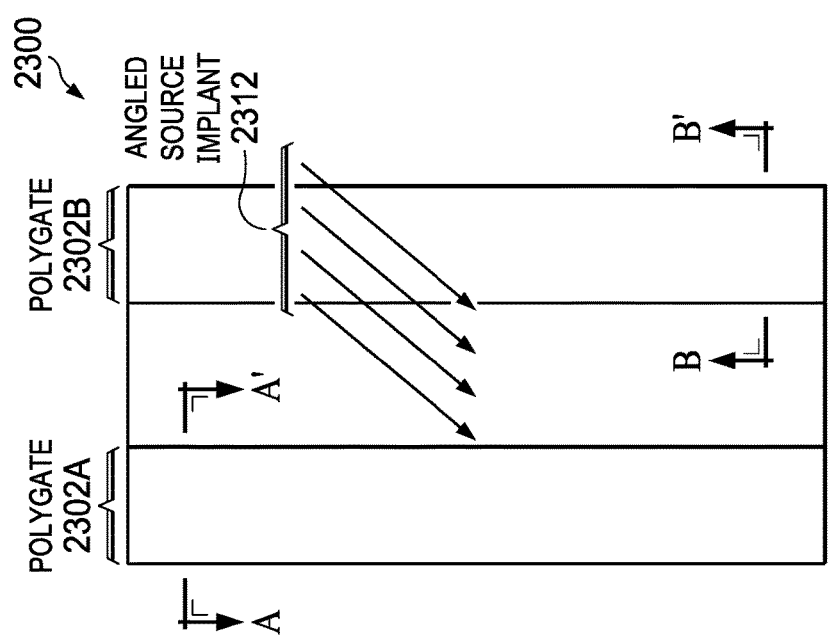
FIG. 23B
FIG. 23A

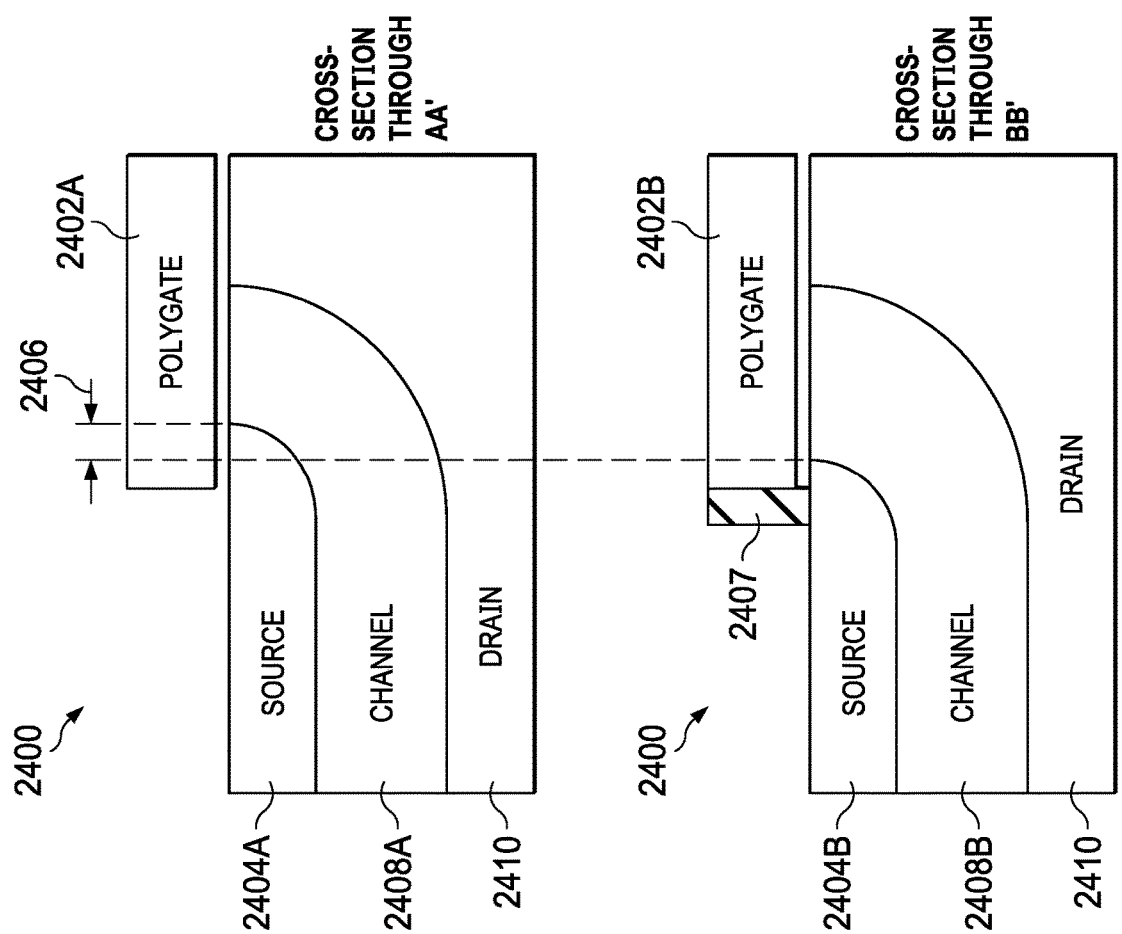
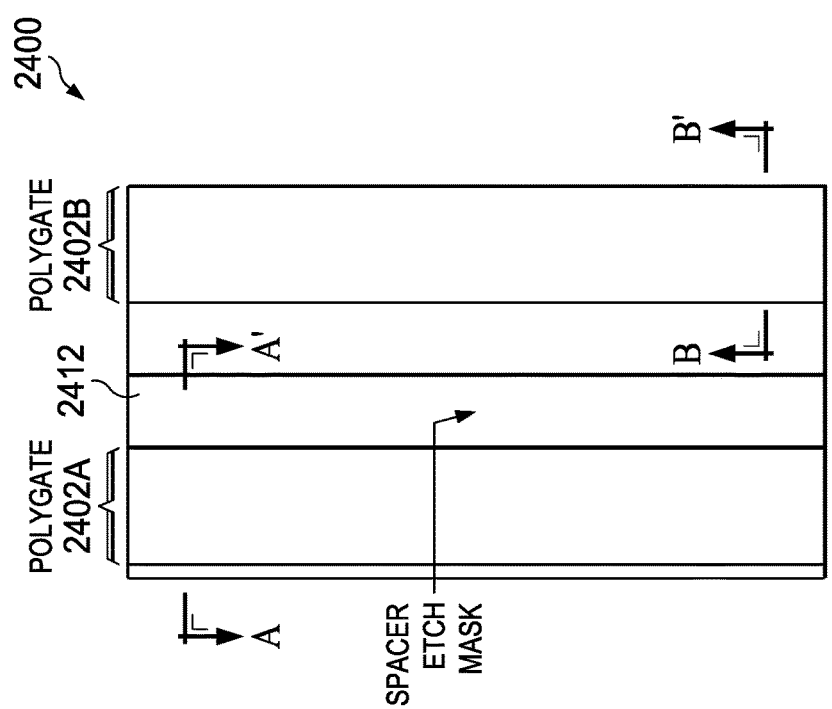
FIG. 24B
FIG. 24A

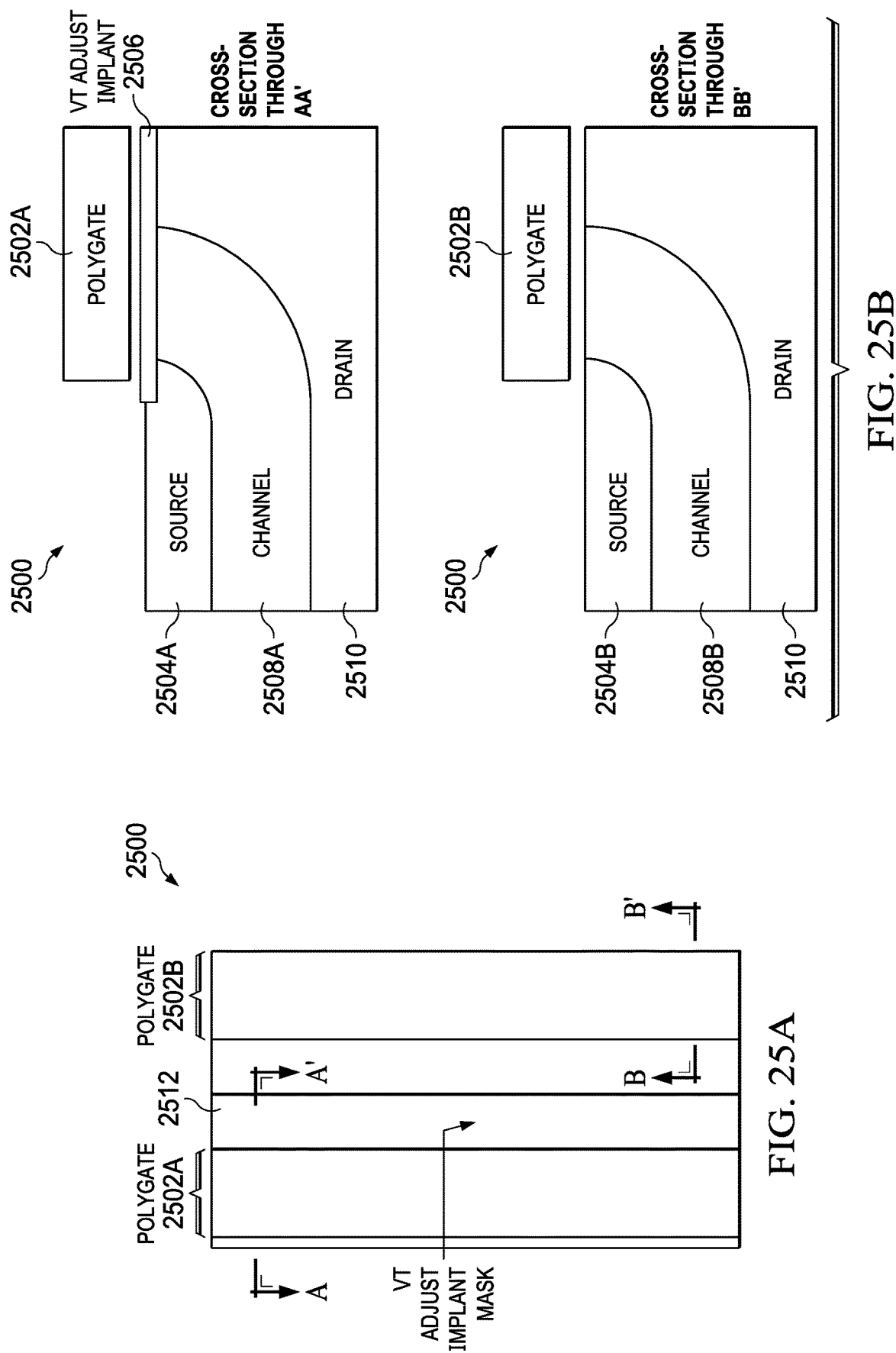

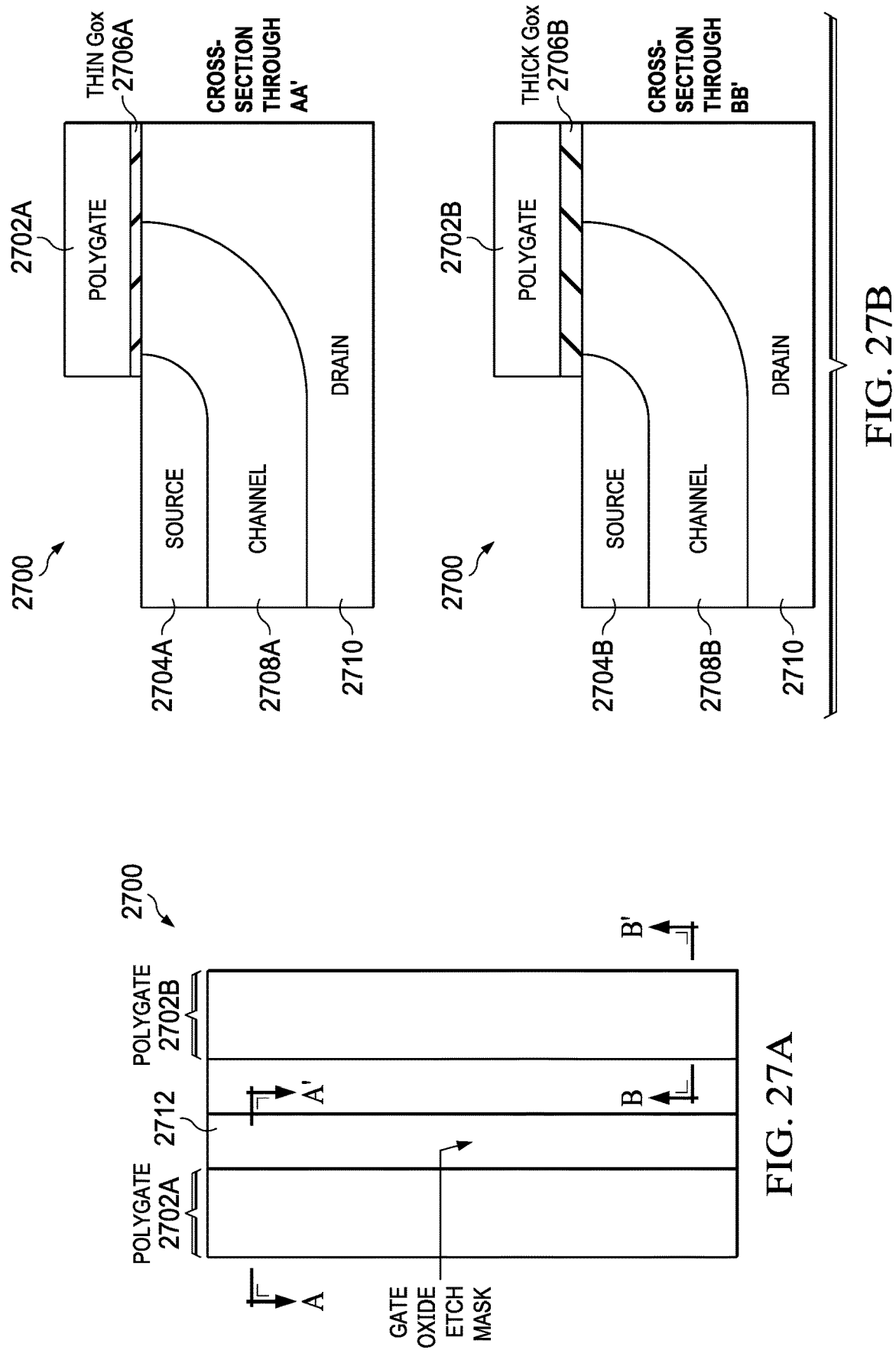

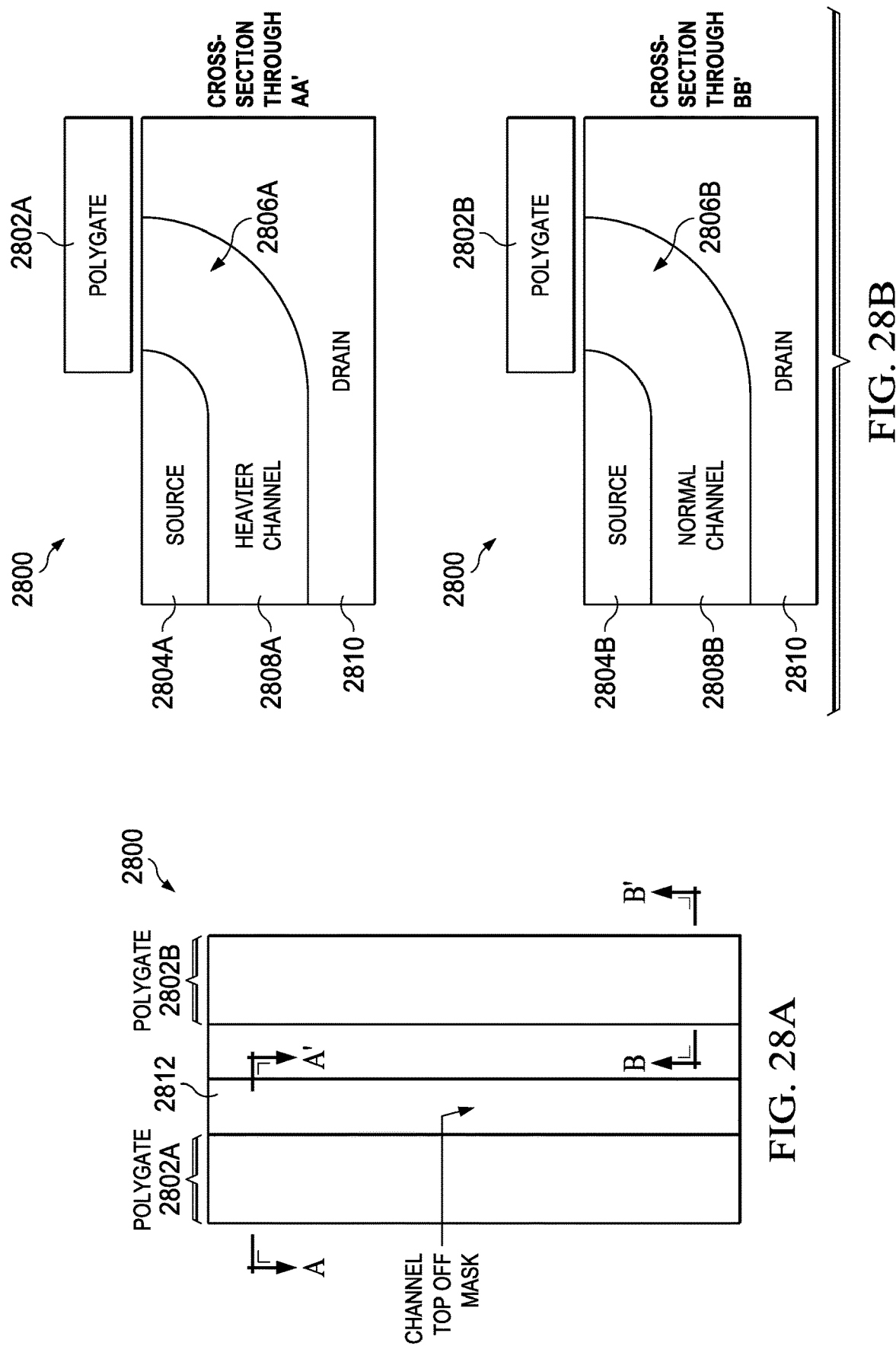

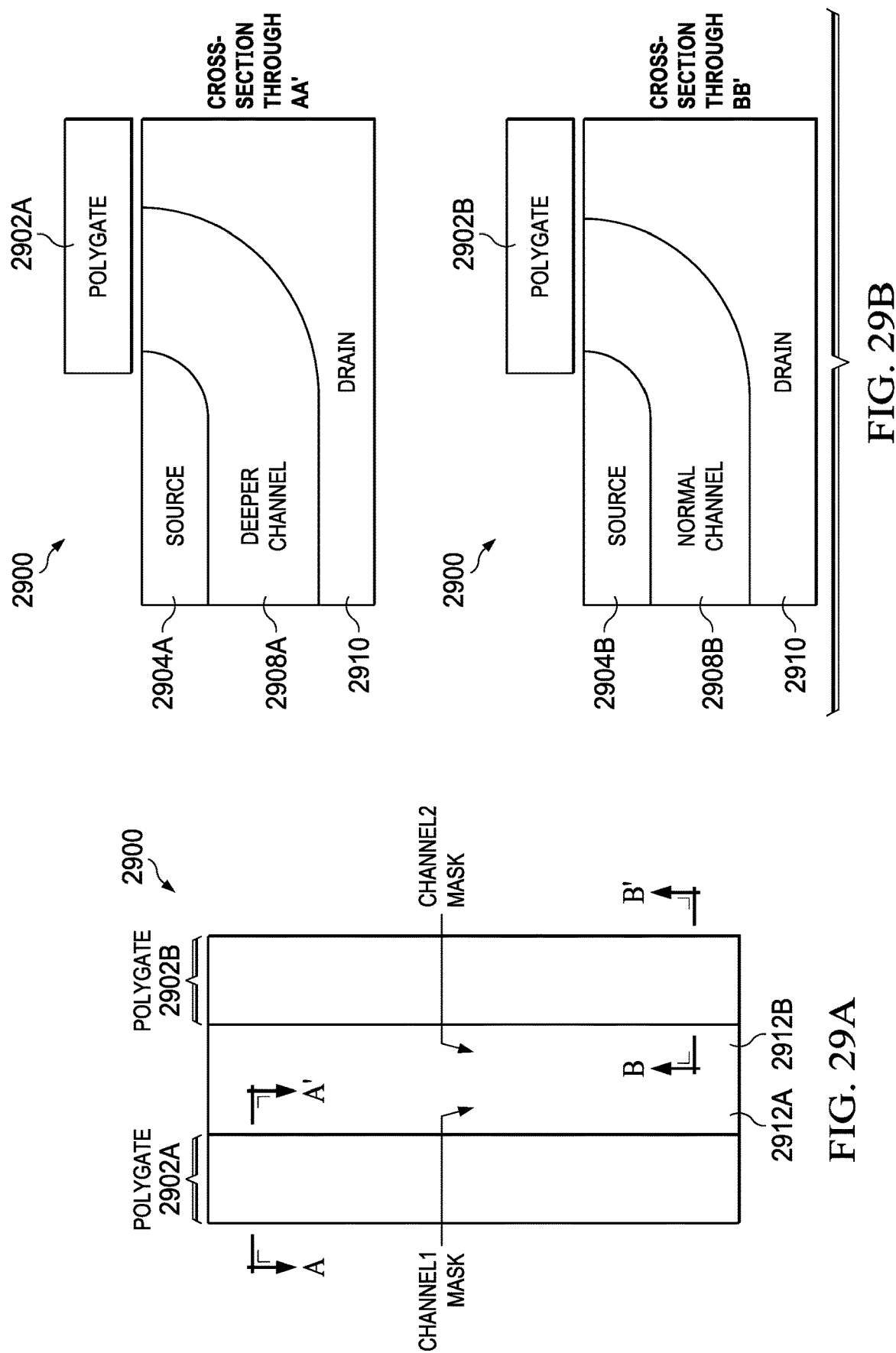

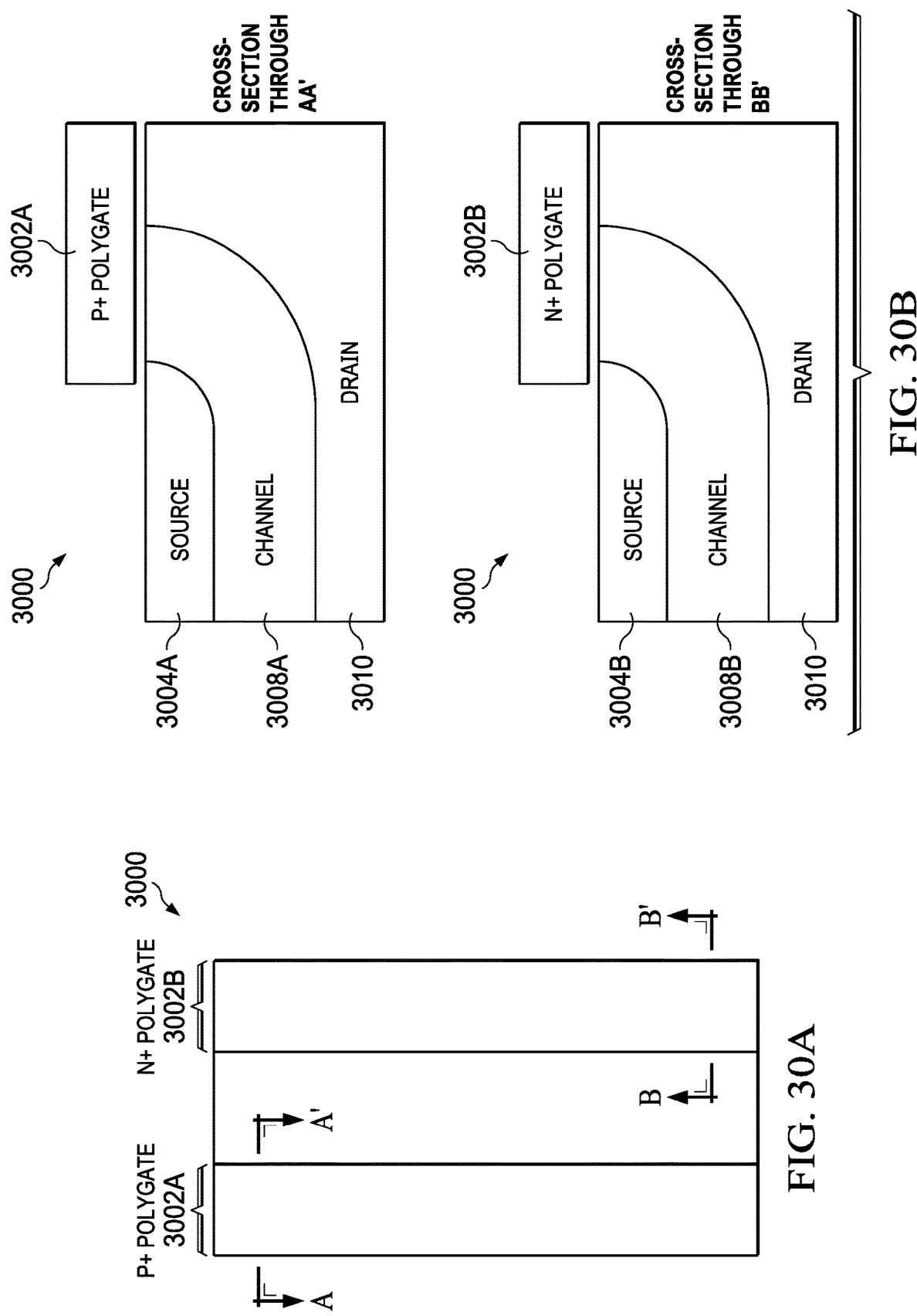

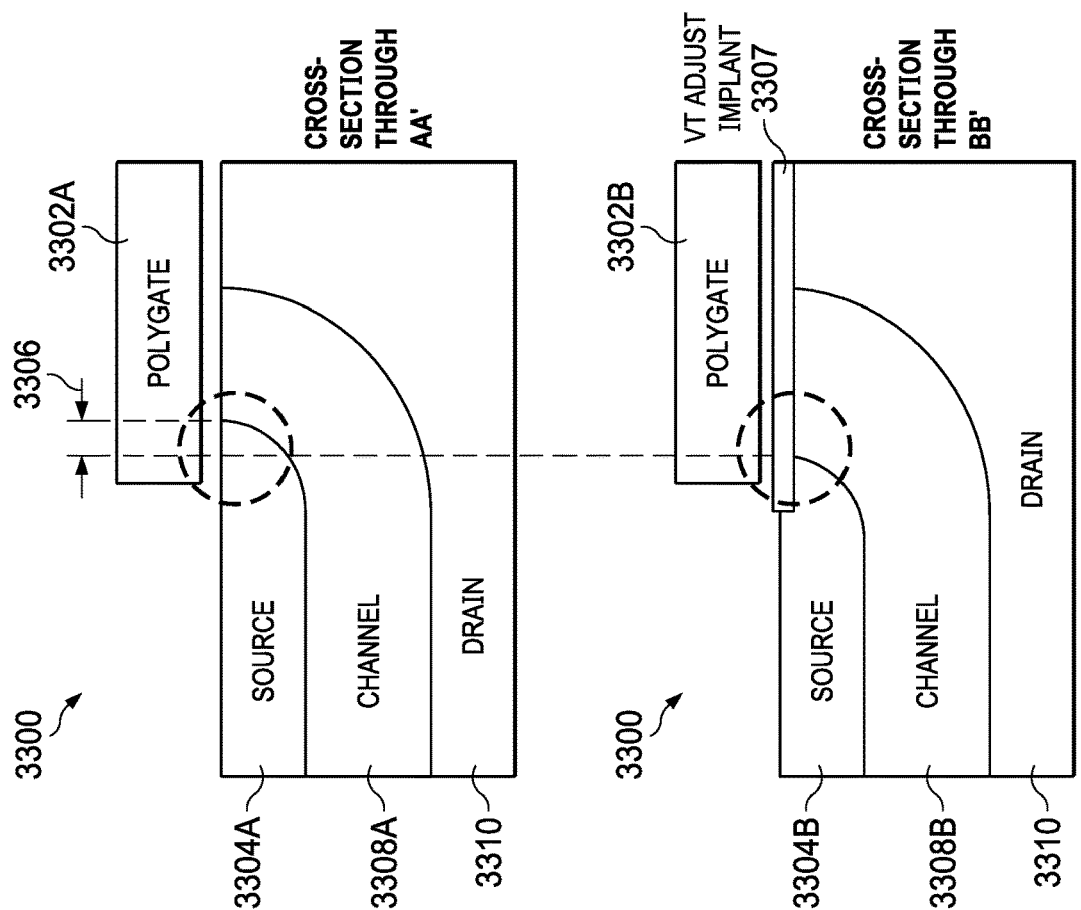

3400

| DESIGN | $Vt_1$ | $Vt_2$ | $\Delta Vt$ | Tm divg | $R_{DS(on)}$ |
|---|---|---|---|---|---|
| | V | V | V | C | mOhm |
| CONVENTIONAL | 3.53 | 3.53 | 0.00 | 20.6 | 31.7 |
| 50% Gm | 3.62 | 3.62 | 0.00 | 10.9 | 43.0 |
| DUAL Vt (50% LOW $\Delta Vt$) | 3.45 | 3.79 | 0.34 | 16.7 | 32.2 |
| DUAL Vt (50% HIGH $\Delta Vt$) | 3.43 | 4.02 | 0.59 | 11.2 | 33.2 |

| SOURCE IMP ENERGY | SOURCE IMP ANGLE | $Vt_1$ | $Vt_2$ | $\Delta Vt$ | Tm divg | $R_{DS(on)}$ |
|---|---|---|---|---|---|---|
| KeV | DEG | V | V | V | C | mOhm |
| 20 | 0 | 3.57 | 3.57 | 0.00 | 21.7 | 31.8 |
| | 5 | 3.54 | 3.81 | 0.27 | 19.8 | 32.1 |
| | 10 | 3.49 | 4.08 | 0.59 | 14.7 | 32.4 |
| | 15 | 3.43 | 4.33 | 0.90 | 12.2 | 32.8 |
| | 20 | 3.36 | 4.54 | 1.18 | 11.5 | 32.9 |
| | | | | | | |
| 50 | 0 | 3.44 | 3.44 | 0.00 | 16.2 | 32.3 |
| | 10 | 3.16 | 4.05 | 0.89 | 9.8 | 32.6 |

| DESIGN | $R_{DS(on)}$ | SOA Id RANGE | SOA Avg_Id | % INCREASE |
|---|---|---|---|---|
| | mOhm | A | A | |
| CONVENTIONAL | 48 | 2.7 - 3.3 | 2.92 | |
| DUAL Vt ANGLED | 48 | 3.7 - 4.0 | 3.79 | 30% |

METHOD OF INCREASING FORWARD BIASED SAFE OPERATING AREA USING DIFFERENT THRESHOLD VOLTAGE SEGMENTS

This application is a divisional of U.S. patent application Ser. No. 16/573,376, filed on Sep. 17, 2019, which application is hereby incorporated herein by reference.

TECHNICAL FIELD

The present invention relates generally to a device and method for increasing Forward Biased Safe Operating Area ("FBSOA") using different threshold voltage segments.

BACKGROUND

Generally, for power semiconductor devices operating in the forward biased "on" state, FBSOA is defined as the available voltage and current conditions over which the device can be expected to operate without causing self-damage. FBSOA is therefore an important consideration in linear mode applications and in the design and use of pass-through Field-Effect Transistors ("FETs"). N-channel Metal-Oxide-Semiconductor FETs ("MOSFETs") are usually used in switching applications and hence FBSOA is sacrificed for $R_{DS(on)}$ "drain-source on resistance" and other parameters. P-channel MOSFETs are usually used in linear mode applications and hence FBSOA is also an important parameter for these devices as well.

It is difficult to improve FBSOA significantly, and operation beyond the FBSOA voltage and current limits will result in a breakdown of the device. Breakdown mechanisms can include, for example, localized heating within the device even if the device is operating with the maximum allowable current and voltage limits, as well as other breakdown mechanisms such as failure of dielectric regions due to the application of excessive voltages, or failure of current carrying structures within and associated with the device due to the application of excessive currents.

SUMMARY

In accordance with an embodiment, a method for increasing a forward biased safe operating area ("FBSOA") of a device comprising forming a gate; and forming a segmented source proximate to the gate, wherein the segmented source comprises a plurality of first segments associated with a first threshold voltage and a plurality of second segments associated with a second threshold voltage different from the first threshold voltage, wherein at least one device characteristic associated with the plurality of first segments is different from the at least one device characteristic associated with the plurality of second segments.

In accordance with another embodiment, a device comprises a gate; and a segmented source proximate to the gate, wherein the segmented source comprises a plurality of first segments associated with a first threshold voltage and a plurality of second segments associated with a second threshold voltage different from the first threshold voltage, and wherein at least one device characteristic associated with the plurality of first segments is different from the at least one device characteristic associated with the plurality of second segments.

In accordance with another embodiment, a device comprises a gate; a first source associated with a first threshold voltage proximate to the gate; and a second source associated with a second threshold voltage different from the first threshold voltage proximate to the gate, wherein at least one source characteristic associated with the first source is different from the at least one source characteristic associated with the second source.

BRIEF DESCRIPTION OF THE DRAWINGS

For a more complete understanding of the present invention, and the advantages thereof, reference is now made to the following descriptions taken in conjunction with the accompanying drawings, in which:

FIG. 6 is a plan view of a power device according to an embodiment comprising a multiple threshold voltage stripe design comprising a first source stripe having a first threshold voltage source segment and a second threshold voltage source segment, and a second source stripe having a third threshold voltage source segment and a fourth threshold voltage source segment;

FIG. 7 is a plan view of a power device according to an embodiment comprising a laddered multiple threshold voltage design comprising a first threshold voltage source segment, a second threshold voltage source segment, a third threshold voltage source segment; and a fourth threshold voltage source segment;

FIG. 8 is a cross-sectional view of a power device according to an embodiment comprising a checkered source design having multiple threshold voltage source segments, comprising a first threshold voltage source segment associated with a first gate stripe, a second threshold voltage source segment associated with a second gate stripe, a third threshold voltage source segment associated with the first gate stripe, and a fourth threshold voltage source segment associated with the second gate stripe;

FIG. 9 is a plan view of a power device according to an embodiment comprising an asymmetrical dual threshold voltage ladder having a plurality of first threshold voltage source segments, and a plurality of second threshold voltage source segments, wherein the second threshold voltage source segments have an area larger than that of the first threshold voltage source segments;

FIG. 10 is a plan view of a power device according to an embodiment comprising an asymmetrical multiple threshold voltage stripe design comprising a first source stripe having a first threshold voltage source segment and a second threshold voltage source segment, and a second source stripe having a third threshold voltage source segment and a fourth threshold voltage source segment, wherein source segment endpoints are staggered;

FIG. 11 is a plan view of a power device according to an embodiment comprising an asymmetrical dual threshold voltage checkered pattern comprising first threshold voltage source segments associated with a first gate stripe and second threshold voltage source segments associated with a second gate stripe, wherein the second threshold voltage source segments have an area larger than that of the first threshold voltage source segments;

FIG. 14 illustrates plan views of various power device cell configurations suitable for comprising segmented sources according to embodiments;

FIG. 23A illustrates a plan view of a power device receiving an angled source implant, and FIG. 23B illustrates cross-sectional views of the power device after having received the angled source implant;

FIG. 24A illustrates a plan view of a power device and a spacer etch mask, and FIG. 24B illustrates cross-sectional views of the power device after having received a source implant using the spacer etch mask;

FIG. 25A illustrates a plan view of a power device and a Vt adjustment implant mask, and FIG. 25B illustrates cross-sectional views of the power device after having received a Vt adjustment implant;

FIG. 27A illustrates a plan view of a power device and a gate oxide etch mask, and FIG. 27B illustrates cross-sectional views of the power device showing thin and thick oxide layers formed using the gate oxide etch mask;

FIG. 28A illustrates a plan view of a power device and a channel top-off mask, and FIG. 28B illustrates cross-sectional views of the power device showing a normal channel and a heavier doped channel using the channel top-off mask;

FIG. 29A illustrates a plan view of a power device and first and second channel masks, and FIG. 29B illustrates cross-sectional views of the power device showing a normal channel and a deeper channel using the first and second channel masks;

FIGS. 30A, 30B, 31A and 31B illustrate plan and cross-sectional views of a power device including gates having different work functions;

FIG. 33A illustrates a plan view of a power device including a Vt adjust implant mask and first and second sources, and FIG. 33B illustrates cross-sectional views of the power device after receiving different source implants and a Vt adjust implant using the Vt adjust implant mask;

FIGS. 34 and 35 are tables of simulation results showing improvement in FBSOA according to embodiments;

FIG. 36 is a table of experimental results showing improvement in FBSOA according to embodiments.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

In order to improve FBSOA, power device embodiments are described herein that comprise a plurality of Vt segments that have different, or multiple, threshold voltages such that a difference $\Delta Vt$ between the threshold voltages of the Vt segments is established. The Vt segments are formed by adjusting device characteristics such as source widths, source doping densities, channel depths, channel doping densities, gate work functions, gate materials, and gate oxide thicknesses, among many other such device characteristics. Adjusting two or more device characteristics can be combined to form Vt segments having an even greater $\Delta Vt$. Power devices described herein can comprise a single power device comprising a plurality of different Vt segments with repeating layout patterns. Alternatively, power devices of a first type of Vt segment can be in a mixed layout with power devices of a second type of Vt segment to obtain the same improvement in FBSOA. The distance between the Vt segments or different type of Vt devices is kept low to avoid hot spots within the power device(s). Many techniques can be used to form the Vt segments and are also described below with respect to several embodiments. The Vt segments can be formed sequentially or simultaneously, in embodiments. The embodiment devices and methods can be adapted to improve the FBSOA of numerous different device configurations.

Figure 1:
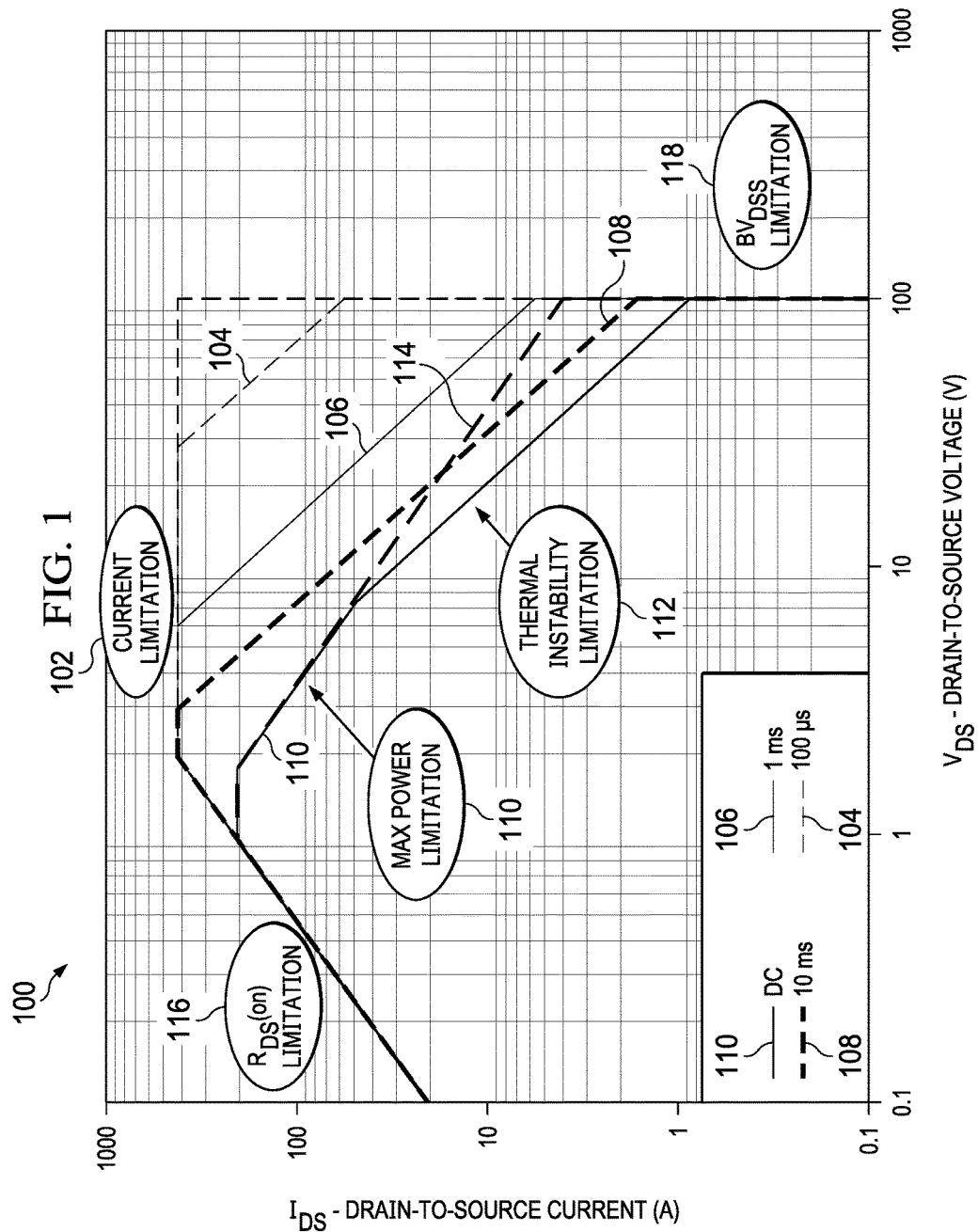
FIG. 1 is a chart of FBSOA for a typical power device.

FIG. 1 shows FBSOA 100 as the area under various limitation curves. For example, FBSOA is limited by a maximum current limitation 102. FBSOA is also limited by maximum power limitations. Power limitation curves are shown for 100 μs (104), 1 ms (106), 10 ms (108), and DC (110). A thermal instability limitation curve 112 and a $R_{DS(on)}$ limitation curve 116 are also shown in FIG. 1.

FBSOA is determined by a complex chain of events involving electrical and thermal imbalances, amplified by a positive feedback at current levels below the zero-temperature coefficient point. A biasing point exists where the drain current and the transconductance of a device are temperature independent. Such a point is known as the zero-temperature coefficient (ZTC) bias point.

An imbalance in electrical characteristics, particularly in the device channel (threshold voltage Vt, and transconductance Gm) may cause higher current density in one location. This leads to higher local power dissipation, resulting in a higher temperature, which then causes lower Vt, thus leading to even higher currents and the cycle continues eventually causing thermal runaway. Even in the absence of electrical imbalances, an inherent thermal impedance imbalance between a die center and die edge causes the center of die to be hotter which then leads to electrical imbalance in Vt leading to eventual thermal run away.

This thermal imbalance is more pronounced in large versus small die leading to failures in die center at currents not proportional to die area.

Referring again to FIG. 1, the thermal instability region reduces FBSOA at high voltages as is seen in limitation curve 112. Reducing the thermal instability would result in an improved maximum power slope as shown by dashed line 114. It is clear that reducing thermal instability significantly increases FBSOA at higher voltages.

For maximizing FBSOA, a relatively low $G_m$ is desirable. However, for minimizing $R_{DS(on)}$, a relatively high $G_m$ is desirable. These are conflicting requirements that are difficult to resolve within a single power device.

According to embodiments described herein, the FBSOA of a transistor can be increased without significantly increasing $R_{DS(on)}$. Each transistor includes multiple Vt source segments, wherein the source segments are energized over different operating conditions, which improves FBSOA with an only a minimal increase in $R_{DS(on)}$. The Vt of the source segments can be realized in various ways including, for example, adjusting a width of the source segment.

According to embodiments described herein, the transconductance of a transistor ($G_m$) can be reduced by reducing the channel width W.

It is known that $G_m=K*Vd*W/L$, wherein K is a proportionality constant, Vd is the drain voltage, W is the channel width of the transistor, and L is the channel length of the transistor.

However, when channel width W is reduced, channel resistance and current spreading resistance increases. This increases the drain-to-source resistance, $R_{DS(on)}$. Using dual (or multiple) Vt segments as described with respect to embodiments herein, a low $G_m$ can be achieved for an increased FBSOA and a high $G_m$ can be achieved for a low $R_{DS(on)}$. Source segments including low and high threshold voltages Vt are distributed uniformly throughout zones of the power device die, so that FBSOA can be improved without sacrificing $R_{DS(on)}$. Various other methods can be used to achieve the multiple threshold voltage Vt source segments, at least one of which is described herein. According to embodiments, multiple Vt source segments are used in a power device integrated circuit die to improve FBSOA with a minimal sacrifice of $R_{DS(on)}$.

Vertical devices are shown and described herein having a vertical current flow between one or more doped source regions at the surface of the device and a common drain and/or drift region at the bottom surface of the device, and wherein the vertical current flow is control by an application of voltage to a polysilicon gate over a channel region between the source region and the drain region. Other devices such as planar devices can also be used. Embodiment concepts can be applied to such power devices as bipolar junction transistors (BJTs), metal-oxide semiconductor field-effect transistors (MOSFETs), thyristors, or insulated-gate bipolar transistors (IGBTs), for example. Other device types can also be used. The source and drain regions described herein can be doped to be either n-type or p-type doped regions.

Figure 2A:
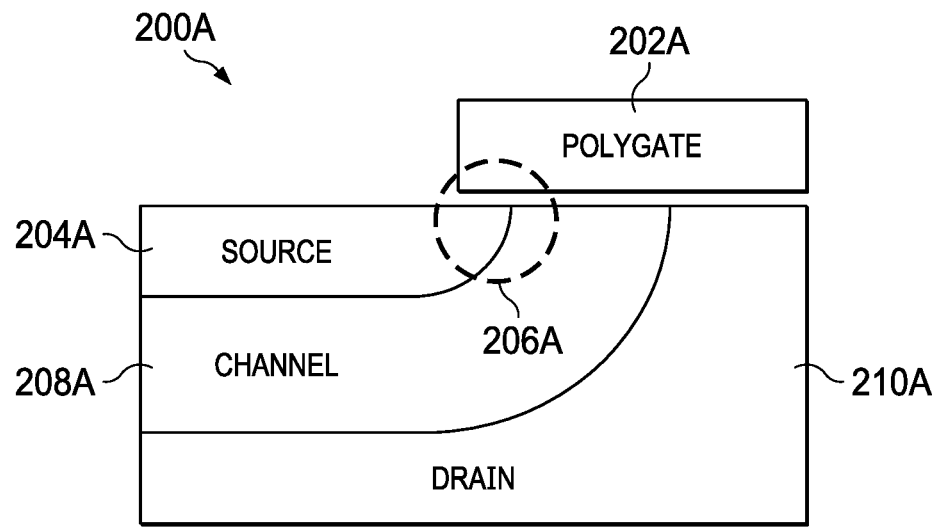
FIG. 2A is a cross-sectional view of a power device with a first source or source segment having a first threshold voltage.

FIG. 2A illustrates a cross-sectional view of a power device 200A, with a first source or source segment having a first threshold voltage. Power device 200A includes a polysilicon gate 202A and a source 204A. Note that polysilicon gate 202A extends over source 206A in dotted region 206A. Power device 200A also includes a channel 208A and a drain 210A, such that the current flow is in a vertical direction through the power device 200A. The threshold voltage in power device 200A has a "normal" or base level.

Figure 2B:
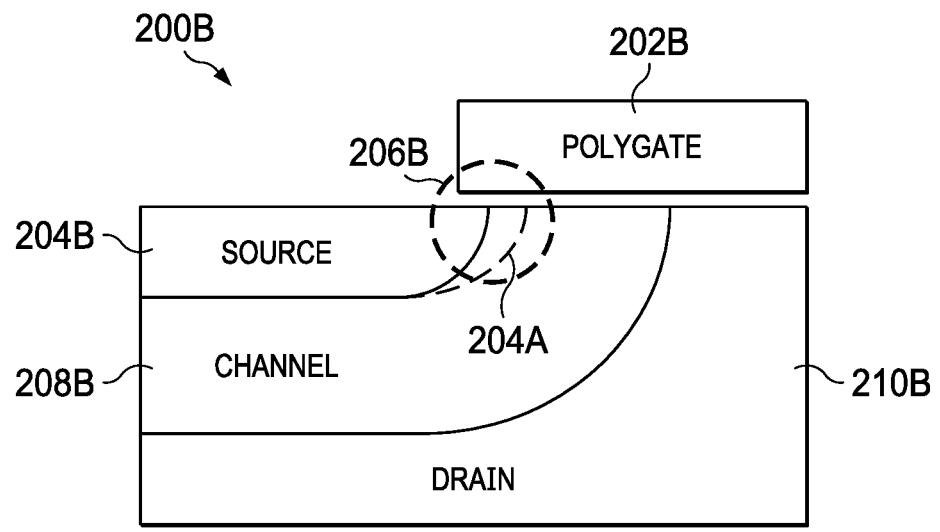
FIG. 2B is a cross-sectional view of a power device with a second source or source segment having a second threshold voltage.

FIG. 2B shows a cross-sectional view of a power device 200B, with a second source or source segment having a second threshold voltage higher than the first threshold voltage of power device 200A shown in FIG. 2A. Power device 200B includes a polysilicon gate 202B and a source 204B. Note that polysilicon gate 202B extends over source 206B in dotted region 206B. Power device 200B also includes a channel 208B and a drain 210B, such that the current flow is in a vertical direction through the power device 200A. The threshold voltage in power device 200B is higher than that of power device 200A since the source diffusion region 204B is smaller than source diffusion region 204A (shown as a dotted line in FIG. 2B).

During a first set of normal operating conditions, and within the FBSOA limits, a relatively low transconductance is realized. During this first set of normal operating conditions, the drain-to-source voltage of the device Vds is relatively high, and the gate-to-source voltage Vgs is relatively low—slightly above the threshold voltage Vt. The device current is carried mainly by device areas having a lower Vt. Device areas having a higher Vt will hardly conduct at the lower Vgs value. Transconductance ($G_m$) during FBSOA is thus dominated by the lower Vt areas and this relatively low $G_m$ can be used to design a device based on improved FBSOA requirements.

During a second set of normal operating conditions, and within the FBSOA limits, a relatively high transconductance is realized. As previously discussed, a high transconductance is desirable for a low $R_{DS(on)}$ value. In the second set of operating condition, Vds is low, and Vgs is high—usually approximately boy above Vt. Both low and high Vt areas are thus fully inverted and both areas conduct current well.

Transconductance ($G_m$) for designing $R_{DS(on)}$ in a device comes from the full channel area and this high $G_m$ gives a corresponding low $R_{DS(on)}$.

Various embodiments of power devices using multiple source segments that have at least two different corresponding threshold voltages to achieve maximum FBSOA with only minimum increases in $R_{DS(on)}$ are described below. The area of a source segment and the "total source area" referenced below may refer to a single instance of the cell configuration of gate and source segments depicted in a particular drawing figure, but it is noted that the particular configuration may be replicated dozens or hundreds of times in an actual power device integrated circuit die. The ratio of the area of a source segment to the total source area may be constant within the integrated circuit die, or may change with respect to a distance from the center of the die as is discussed in further detail below in embodiments.

Figure 3:
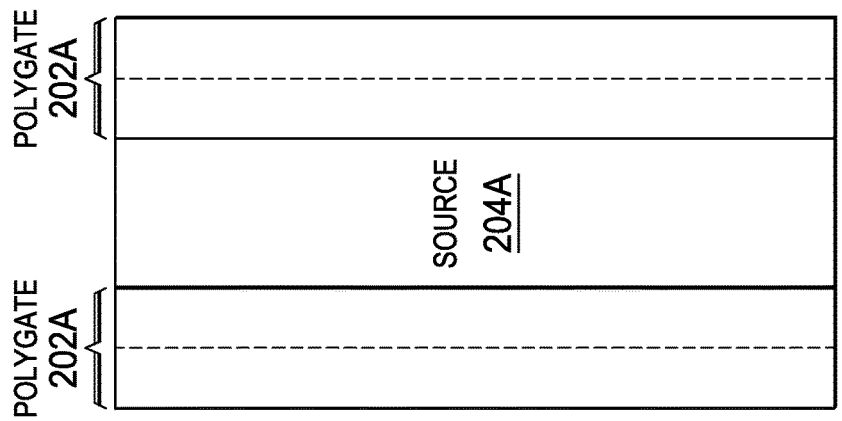
FIG. 3 is a plan view of the power device shown in FIG. 2A comprising two gate stripes and a single source stripe.

FIG. 3 is a plan view corresponding to the power device 200A shown in FIG. 2A comprising two gate stripes 202A and a single source stripe 204. The typical power device shown in FIG. 3 may suffer thermal instability limitations at higher voltages along curve 112 as is explained above with respect to FIG. 1. Note that polysilicon gates 202A overlap source region 204A, as was shown in the cross-sectional view of power device 200A in FIG. 2A.

Figure 4:
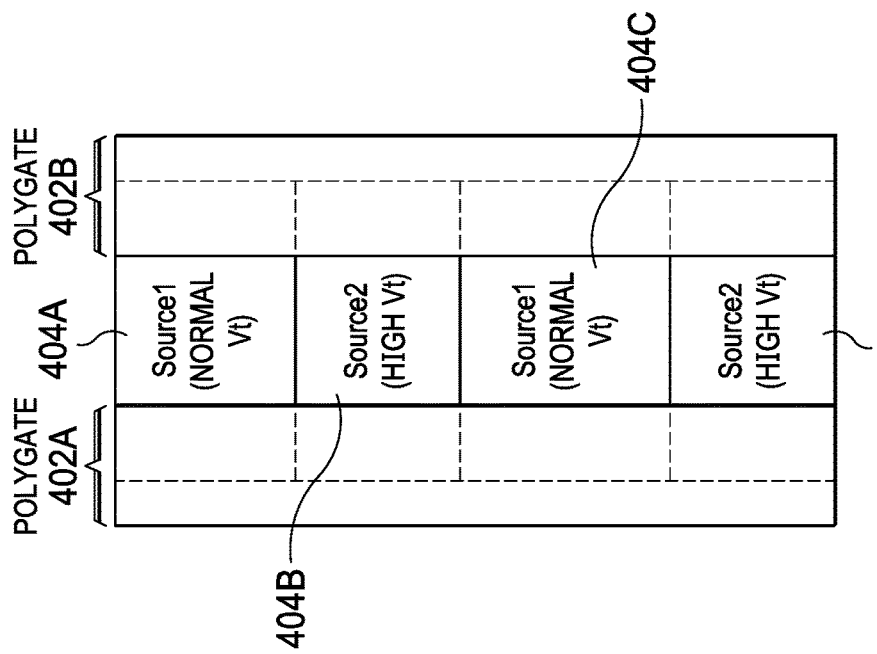
FIG. 4 is a plan view of a power device according to an embodiment comprising a laddered dual source comprising a plurality of first source segments having a first threshold voltage and a plurality of second source segments having a second threshold voltage.

FIG. 4 is a plan view of a power device having a symmetrical laddered source according to an embodiment comprising a laddered dual source comprising a first gate stripe 402A, a second gate stripe 402B, a plurality of first source segments 404A, 404C corresponding to a first threshold voltage (normal Vt) and a plurality of second source segments 404B, 404D corresponding to a second threshold voltage (high Vt). In FIG. 4, the second threshold voltage is higher than the first threshold voltage. In the embodiment of FIG. 4, the total area of the first threshold voltage source segments is about 50% of the total source area and the total area of the second threshold voltage source segments is about 50% of the total source area. Gate stripes 402A and 402B overlap edges of the source segments. The exact edge dimensions of the source segments are not shown in FIG. 4 for convenience, but may be different from one another as was shown in FIGS. 2A and 2B in order to obtain the different threshold voltages. Other mechanisms are known for generating different source threshold voltages, in which case the exact edge dimensions of the source segments may be equal as is shown in FIG. 4. For example, the width of source 404A may have a dimension of 3.2 µm, and the width of source 404B may have a different dimension of 3.0 µm in an embodiment. The width of source 404A, however, may have the same dimensions as the width of source 404B in an embodiment, and yet have a different threshold voltage realized with a completely different mechanism, such as varying the dopant density of each source segment.

Figure 5:
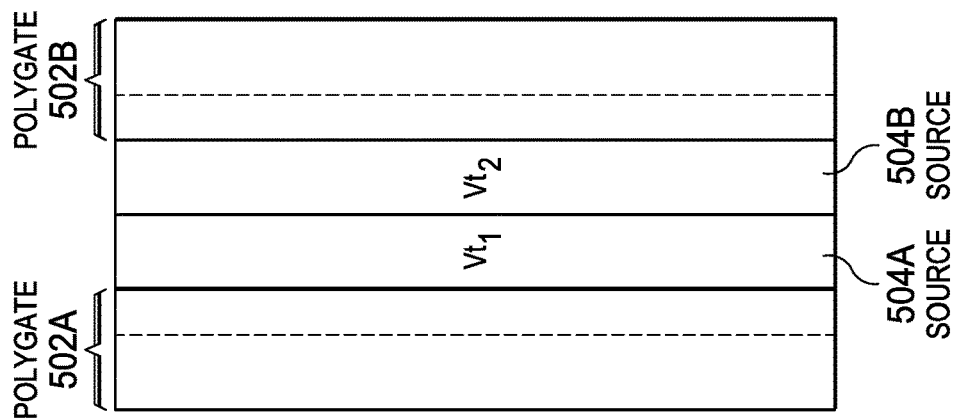
FIG. 5 is a plan view of a power device according to an embodiment comprising a dual threshold voltage stripe design comprising a first source stripe having a first threshold voltage and a second source stripe having a second threshold voltage.

FIG. 5 is a plan view of a power device according to an embodiment comprising a dual threshold voltage stripe design comprising a first polysilicon gate stripe 502A, a second polysilicon gate stripe 502B, a first source stripe 504A having a first threshold voltage, and a second source stripe 504B having a second threshold voltage. In the embodiment of FIG. 5, the total area of the first threshold voltage source stripe 504A is about 50% of the total source area and the total area of the second threshold voltage source stripe is about 50% of the total source area. Gate stripes 502A and 502B overlap edges of the source stripes. The exact edge dimensions of the source stripes are not shown in FIG. 4 for convenience, but may be different from one another as was shown in FIGS. 2A and 2B in order to obtain the different threshold voltages. Other mechanisms are known for generating different source threshold voltages, in which case the exact edge dimensions of the source segments may be equal as is shown in FIG. 5. For example, the width of source 504A may have a dimension of 1.50 µm, and width of source 504B may have a different dimension of 1.60 µm in an embodiment. The width of source 504A, however, may have the same dimensions as the width of source 504B in an embodiment, and yet have a different threshold voltage realized with a completely different mechanism, such as varying the dopant density of each source segment.

FIG. 6 is a plan view of a power device according to an embodiment comprising a multiple threshold voltage stripe design comprising a first polysilicon gate stripe 602A, a second polysilicon gate stripe 602B, a first source stripe 604A/604C having a first threshold voltage source segment 604A and a second threshold voltage source segment 604C, and a second source stripe 604B/604D having a third threshold voltage source segment 604B and a fourth threshold voltage source segment 604D. The gate stripes overlap the source segments as previously discussed. Source segment 604A occupies about 25% of the total source area and has a threshold voltage of Vt2, source segment 604B occupies about 25% of the total source area and has a threshold voltage of Vt3, source segment 604C occupies about 25% of the total source area and has a threshold of Vt1, and source segment 604D occupies about 25% of the total source area and has a threshold of Vt4, wherein at least two of the threshold voltage are different. In an embodiment, Vt1≠Vt2≠Vt3≠Vt4. The exact edge dimensions of the source segments may or may not be as shown in FIG. 6 for the reasons discussed above.

FIG. 7 is a plan view of a power device according to an embodiment comprising a laddered multiple threshold voltage design comprising a first polysilicon gate stripe 702A, a second polysilicon gate stripe 702B, a first threshold voltage source segment 704A, a second threshold voltage source segment 704B, a third threshold voltage source segment 704C, and a fourth threshold voltage source segment 704D. The gate stripes overlap the source segments as previously discussed. Source segment 704A occupies about 25% of the total source area and has a threshold voltage of Vt4, source segment 704B occupies about 25% of the total source area and has a threshold voltage of Vt3, source segment 704C occupies about 25% of the total source area and has a threshold of Vt2, and source segment 704D occupies about 25% of the total source area and has a threshold of Vt1, wherein at least two of the threshold voltage are different. In an embodiment, Vt1≠Vt2≠Vt3≠Vt4. The exact edge dimensions of the source segments may or may not be as shown in FIG. 7 for the reasons discussed above.

FIG. 8 is a plan view of a power device having a symmetrical checkered source according to an embodiment comprising a checkered source design having a first polysilicon gate stripe 802A, a second polysilicon gate stripe 802B, multiple threshold voltage source segments, comprising a first threshold voltage source segment 804B associated with the first gate stripe 802A, a second threshold voltage source segment 804A associated with the second gate stripe 802B, a third threshold voltage source segment 804D associated with the first gate stripe 802A, and a fourth threshold voltage source segment 304C associated with the second gate stripe 802B. The gate stripes overlap one edge of the source segments. Source segment 804A occupies about 12.5% of the total source area and has a threshold voltage of Vt4, source segment 804B occupies about 12.5% of the total source area and has a threshold voltage of Vt3, source segment 804C occupies about 12.5% of the total source area and has a threshold of Vt2, and source segment 804D occupies about 12.5% of the total source area and has a threshold of Vt1, wherein at least two of the threshold voltage are different. In an embodiment, Vt1≠Vt2≠Vt3≠Vt4. The exact edge dimensions of the source segments may or may not be as shown in FIG. 8 for the reasons discussed above.

The checkered source embodiment shown in FIG. 8 uses multiple Vt source segments as well as source segmentation (source segment not completely extending between both source stripes, for example). The embodiment of FIG. 8 thus combines both source segmentation (without the use of multiple Vt source segments) and multiple Vt aspects. The embodiment of FIG. 8 thus has a very high FBSOA, but also has a relatively minor $R_{DS(on)}$ penalty. Source segmentation is further discussed in co-pending U.S. patent application Ser. No. 16/167,915, filed on Oct. 23, 2018, entitled "Increasing Forward Biased Safe Operating Area by Source Segmentation", which is hereby incorporated by reference in its entirety.

FIG. 9 is a plan view of a power device having an asymmetrical laddered source according to an embodiment comprising an asymmetrical laddered dual source comprising a first gate stripe 902A, a second gate stripe 902B, a plurality of first source segments 904B, 904D having a first threshold voltage (normal Vt) and a plurality of second source segments 904A, 904C having a second threshold voltage (high Vt). In FIG. 9, the second threshold voltage is higher than the first threshold voltage. In the embodiment of FIG. 4, the total area of the first threshold voltage source segments is less than 50% of the total source area and the total area of the second threshold voltage source segments is more than 50% of the total source area. Gate stripes 902A and 902B overlap edges of the source segments. The exact edge dimensions of the source segments are not shown in FIG. 9, but may be different from one another as was shown in FIGS. 2A and 2B in order to obtain the different threshold voltages. Other mechanisms are known for generating different source threshold voltages, in which case the exact edge dimensions of the source segments may be equal as is shown in FIG. 9.

FIG. 10 is a plan view of a power device according to an embodiment comprising an asymmetrical multiple threshold voltage stripe design comprising a first polysilicon gate stripe 1002A, a second polysilicon gate stripe 1002B, a first source stripe 1004B/1004C having a first threshold voltage source segment 1004C and a second threshold voltage source segment 1004B, and a second source stripe 1004A/1004D having a third threshold voltage source segment 1004A and a fourth threshold voltage source segment 1004D. The gate stripes overlap the source segments as previously discussed. Source segment 1004A occupies about 25% of the total source area and has a threshold voltage of Vt3, source segment 1004B occupies about 25% of the total source area and has a threshold voltage of Vt2, source segment 1004C occupies about 25% of the total source area and has a threshold of Vt1, and source segment 604D occupies about 25% of the total source area and has a threshold of Vt4, wherein at least two of the threshold voltage are different. In an embodiment, Vt1≠Vt2≠Vt3≠Vt4. The exact edge dimensions of the source segments may or may not be as shown in FIG. 10 for the reasons discussed above.

In FIG. 10, the asymmetry of the design used can occur from the staggered bottom and top edges of the source segments and from the source area of the source segments. For example, while a 25% equal source area for each of the source segments with staggered bottom and top edges of the source segments can be used, the percentages of each of the source segments can be adjusted to be less than or greater than 25%. The total source area of the source segments may equal 100% of the total available source area, but source segmentation as shown in, for example, FIG. 9, may make the total source area less than 100% of the available source area.

FIG. 11 is a plan view of a power device having an asymmetrical checkered source according to an embodiment comprising an asymmetrical checkered source design having a first polysilicon gate stripe 1102A, a second polysilicon gate stripe 1102B, multiple threshold voltage source segments, comprising a first threshold voltage source segment 1104B associated with the first gate stripe 1102A, a second threshold voltage source segment 1104A associated with the second gate stripe 1102B, a third threshold voltage source segment 1104D associated with the first gate stripe 1102A, and a fourth threshold voltage source segment 1104C associated with the second gate stripe 1102B. The gate stripes overlap one edge of the source segments. Source segment 1104A occupies more than 12.5% of the total source area and has a threshold voltage of Vt2, source segment 1104B occupies less than 12.5% of the total source area and has a threshold voltage of Vt1, source segment 1104C occupies more than 12.5% of the total source area and has a threshold of Vt2, and source segment 704D occupies less than 12.5% of the total source area and has a threshold of Vt1, wherein the threshold voltages Vt1 and Vt2 are different. The exact edge dimensions of the source segments may or may not be as shown in FIG. 1 for the reasons discussed above.

The asymmetrical checkered source embodiment shown in FIG. 11 uses dual Vt source segments (multiple Vt source segments can also be used) as well as source segmentation (source segment not completely extending between both source stripes, for example). The embodiment of FIG. 1 thus also combines both source segmentation and dual or multiple Vt aspects. The embodiment of FIG. 1 thus has also has very high FBSOA, but also has a relatively minor $R_{DS(on)}$ penalty.

While device embodiments with source stripes and source stripe segments have been shown and described, embodiment concepts can be applied to trench gate device embodiments. A first portion of a power device can have a trenched gate and corresponding source segments having a first threshold voltage. A second portion of the power device can have a trenched gate and corresponding source segments having a second threshold voltage. The first and second threshold voltages can be realized with differences in the source segments dimensions, but can be also realized through other mechanisms such as, for example, changing source doping density values.

Figure 12A:
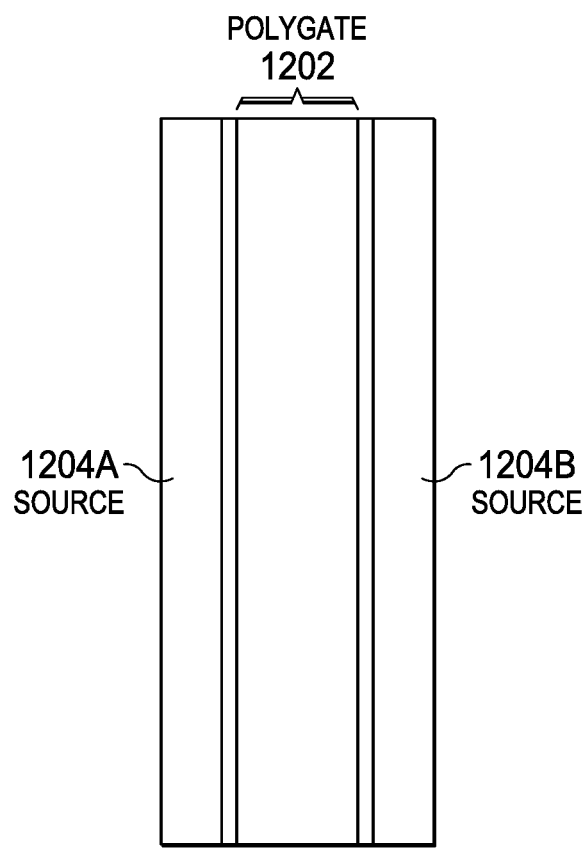
FIG. 12A is a plan view of a power device having a trenched gate according to the prior art.
Figure 12B:
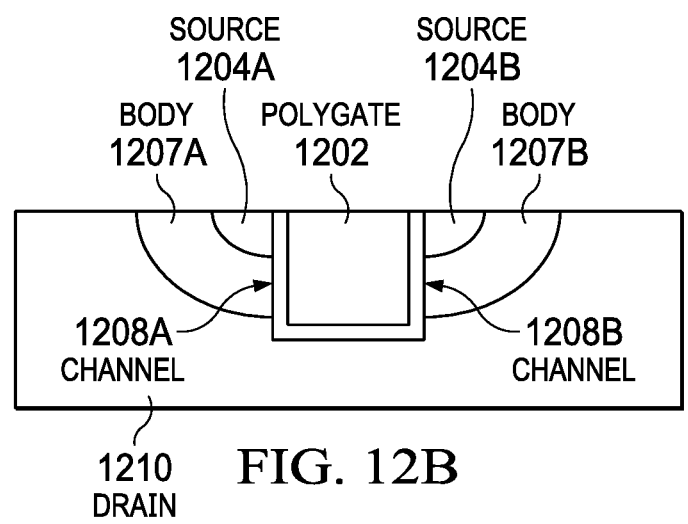
FIG. 12B is a cross-sectional view of the power device corresponding to the plan view of FIG. 12A.

FIG. 12A is a plan view of a conventional trenched gate power device having a polysilicon trench gate 1202 and two adjacent sources 1204A and 1204B. FIG. 12B is a cross-sectional view of the power device corresponding to the plan view of FIG. 12A, including trenched gate 1202, doped sources 1204A and 1204B, channel 1208A and 1208B, body 1207A and 1207B, and drain 1210 extending to a bottom surface of the power device. In FIGS. 12A and 12B the dimensions and doping densities of sources 1204A and 1204B are the same, and thus the trenched gate power device has a single threshold voltage.

Figure 13B:
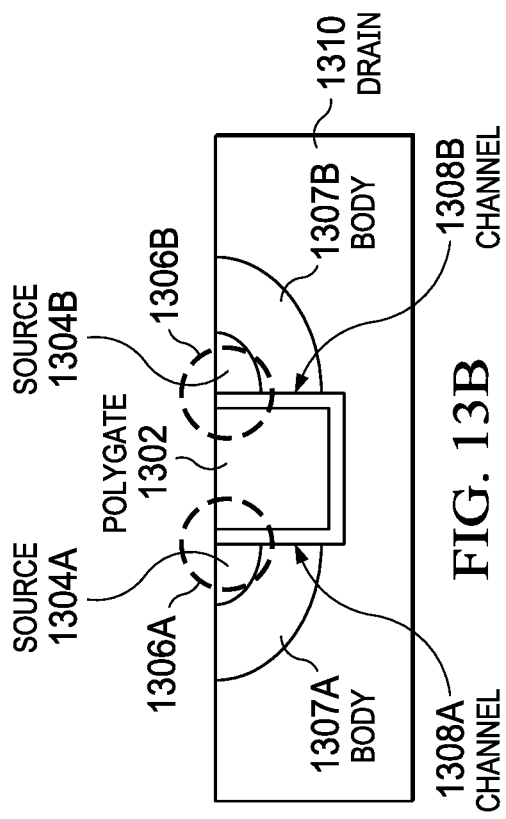
FIG. 13B is a first cross-sectional view of the power device corresponding to the plan view of FIG. 13A.
Figure 13C:
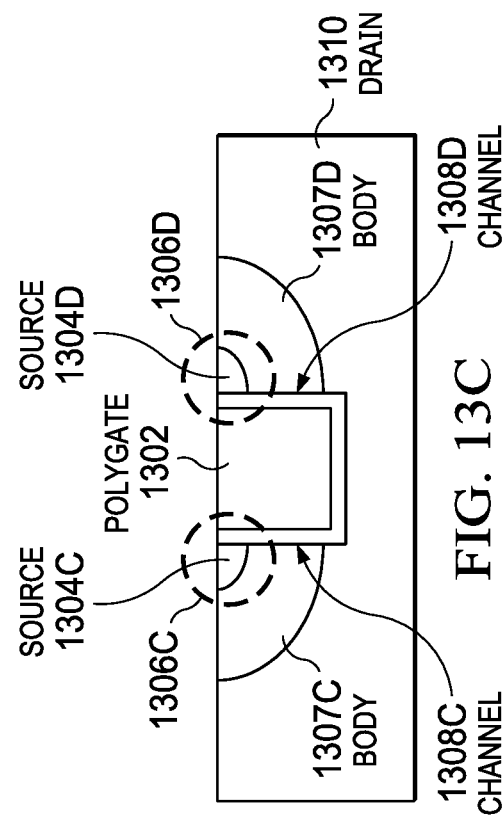
FIG. 13C is a second cross-sectional view of the power device corresponding to the plan view of FIG. 13A.
Figure 13A:
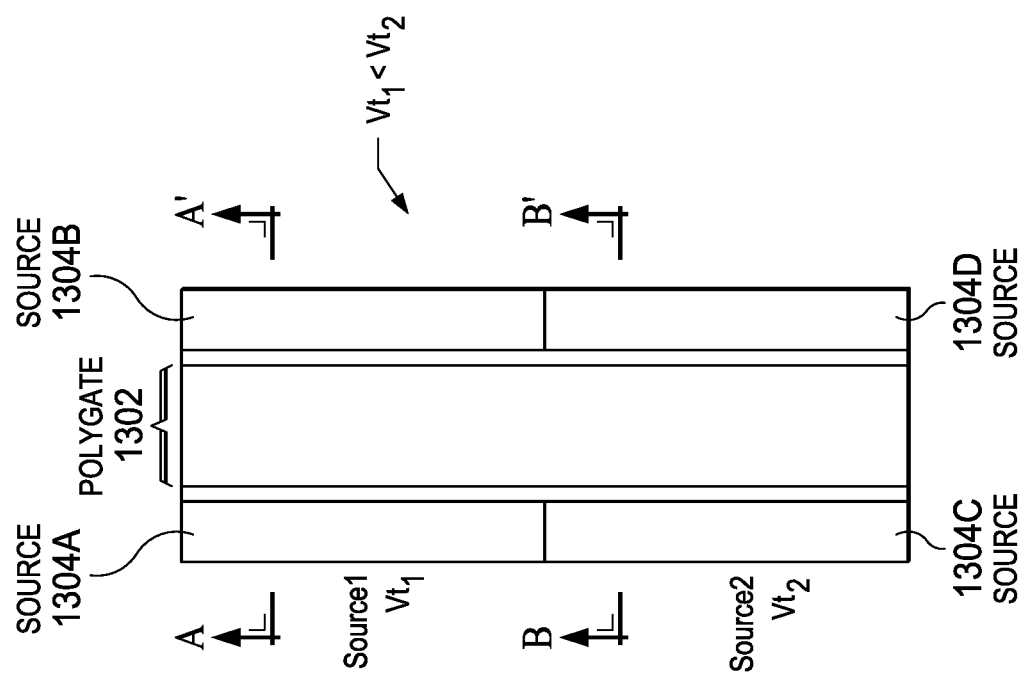
FIG. 13A is a plan view of a power device having a trenched gate and a segmented source including a first threshold voltage segment and a second threshold voltage segment according to an embodiment.

FIG. 13A is a plan view of a power device having a trenched gate 1302 and a laddered segmented source including sources 1304A, 1304B, 1304C, and 1304D according to an embodiment. In FIG. 13A the source depths are all shown as being equal for convenience. In some embodiments, the source depths may actually be equal and the differing corresponding threshold voltage are realized using a different mechanism such as source doping densities, for example. Thus, in an embodiment, the depth of sources 1304A and 1304B may be 0.20 μm, and the depth of sources 1304C and 1304D may be a different dimension of 0.10 μm. In another embodiment, the depth of sources 1304A, 1304B, 1304C, and 1304D may all be the same and the difference in threshold voltages may be realized for doping sources 1304A and 1304B to a first doping density, and doping sources 1304C and 1304D to a second doping density.

FIG. 13B is a first cross-sectional view of the power device corresponding to the plan view of FIG. 13A along line AA', including trenched gate 1302, doped source 1304A and 1304B, channel 1308A and 1308B, body 1307A and 1307B, and drain 1310 extending to a bottom surface of the power device. FIG. 13C is a second cross-sectional view of the power device corresponding to the plan view of FIG. 13A along line BB', including trenched gate 1302, doped source 1304C and 1304D, channel 1308C and 1308D, body 1307C and 1307D, and drain 1310 extending to a bottom surface of the power device.

Note that in FIGS. 13A, 13B, and 13C source segments 1304A and 1304B are associated with a first threshold voltage Vt1 and source segments 1304C and 1304D are associated with a second threshold voltage Vt2. The threshold voltages Vt1 and Vt2 have different values in an embodiment. While only the laddered segmented source technique is described and shown in the trench device example of FIGS. 13A, 13B, and 13C any of the other source segmentation techniques having source segments with differing threshold voltages described herein can be used as well.

FIG. 14 illustrates plan views of various power device cell configurations suitable for comprising segmented sources (with the same or different threshold voltages) according to embodiments. Shown in the table 1400 of FIG. 14 are seven different cellular designs commonly used for power devices. Table 1400 shows a linear cell 1402 and a square well in a square cell 1404. The linear cell 1402 was previously shown and described with respect to FIGS. 4 through 13A. The square well in a square cell is shown and described in further detail below with respect to FIGS. 15A through 15C. In general, the "well" designation will correspond to the source layout configuration, and the "cell" designation will correspond to the outer polysilicon gate layout configuration. Thus, table 1400 also shows a circular well in a square cell 1406, a hexagonal well in a square cell 1408, a square well in a hexagonal cell 1410, a circular well in a hexagonal cell 1412, and a hexagonal well in a hexagonal cell 1414. Rectangular cells are also used. The source segmentation previously illustrated and described, particularly with respect to FIGS. 21B and 21C, can be applied to any of these cellular layouts. For example, a segmented source can be used where the cell comprises a square, rectangular, or hexagonal cell. A segmented source can be used where source perimeter comprises a square, circle, rectangle or hexagonal perimeter. Any of the other source segmentation features shown and previously described with respect to the linear cell can also be used, for example the use of evenly or irregularly spaced source segments or the use of source segments with rounded corners. Cellular power devices having segmented sources can also be used in the radial variation of the source segmentation according to embodiments, which is described in further detail below.

Figure 15A:
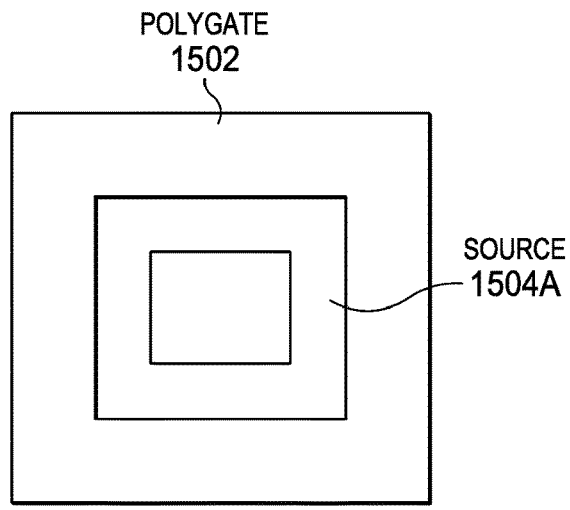
FIG. 15A is a plan view of cellular power device having a square source in a square cell according to the prior art.

FIG. 15A is a plan view of an exemplary cellular power device having a square source 1504 in a square cell 1502 according to the prior art. The cellular power device shown in FIG. 15A has a single threshold voltage as is known in the art.

Figure 15B:
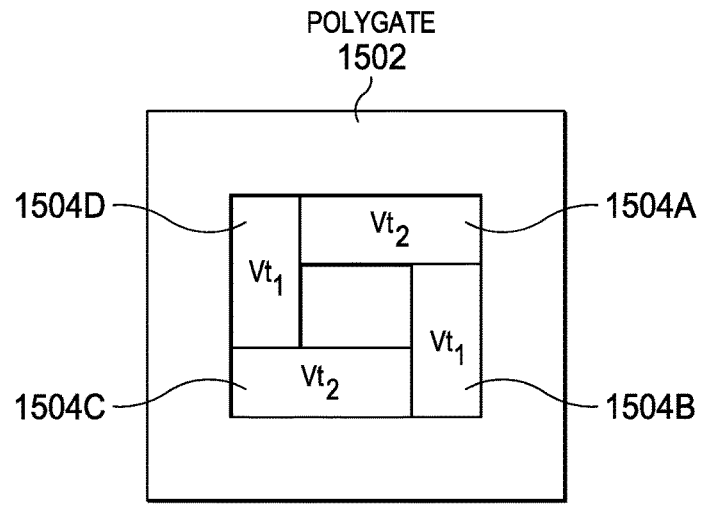
FIG. 15B is a plan view of a cellular power device having a segmented square source with two threshold voltage source segments in a square cell according to an embodiment.

FIG. 15B is a plan view of a cellular power device having a segmented square source with two source segments 1504B and 1504D having a first threshold voltage Vt1 and two source segments 1504A and 1504C having a second threshold voltage Vt2 in a square cell 1502 according to an embodiment. In the embodiment of FIG. 15B the threshold voltages Vt1 and Vt2 are different.

Figure 15C:
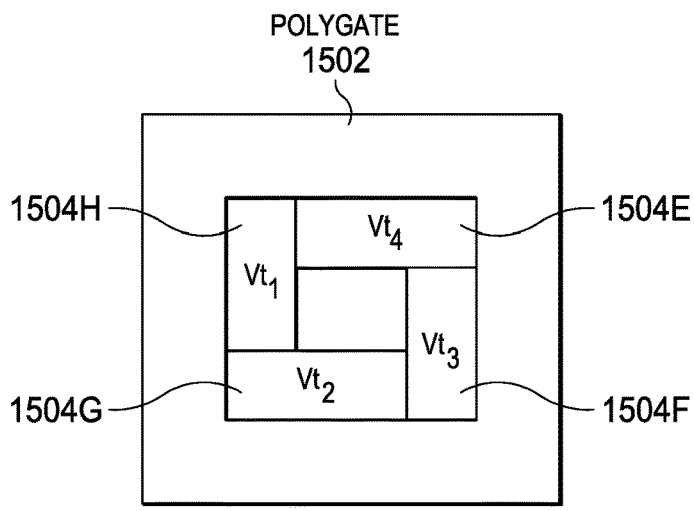
FIG. 15C is a plan view of a cellular power device having a segment square source with four threshold voltage source segments in a square cell according to an embodiment.

FIG. 15C is a plan view of a cellular power device having a segmented square source with four source segments 1504E having a threshold voltage Vt4, 1504F having a threshold voltage Vt3, 1504G having a threshold voltage Vt2, and 1504H having a threshold voltage Vt1, all in a square cell 1502 according to an embodiment. In an embodiment at least two of the threshold voltages are different from each other, and Vt1≠Vt2≠Vt3≠Vt4 in an embodiment.

While checkered source, laddered source, and cellular source segmented patterns have been shown, other geometrical patterns can be used for source segmentation and for using sources or source segments with differing threshold voltages. Some examples of segmented sources were shown and described above, but are not intended to be limiting. Other such segmented source patterns can be made for improving thermal stability at higher operating voltages.

The pattern pitch (for example the ladder or checker pitch) is ideally kept small so that temperature is uniform across the device. A range of few microns to tens of microns can be used in an embodiment.

Figures 16, 17, 18:
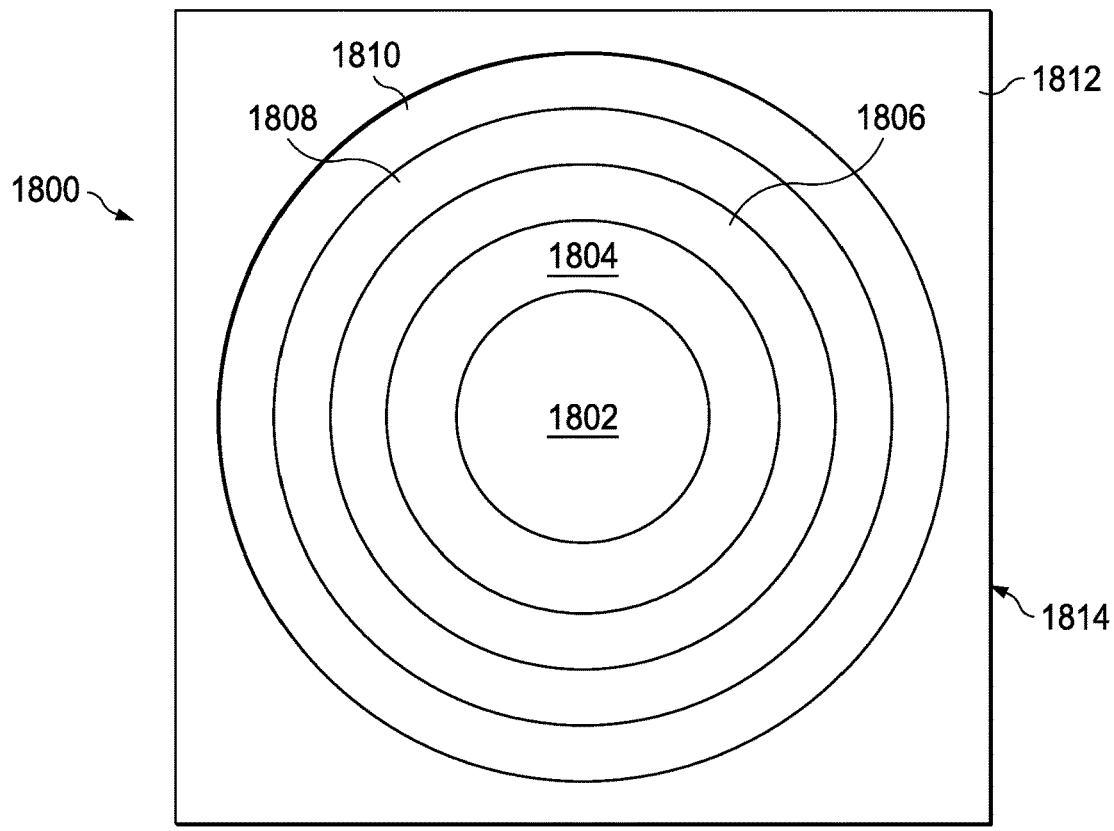
FIG. 16 is a table of simulation results for assessing the performance of segmented source devices according to embodiments.
FIG. 17 is a table of experimental results for assessing the performance of segmented source devices according to embodiments.
FIG. 18 is a plan view of the simulated thermal resistance of an integrated circuit die comprising a power device, in an embodiment.

FIG. 16 is a table 1600 of simulation results for assessing the performance of segmented source devices with multiple threshold voltage segments according to embodiments. Source segmentation is compared for a conventional device (100% source area utilized corresponding to, for example the device FIG. 3), for a 50% $G_m$ device (only 50% of the available source area utilized corresponding to, for example the device of FIG. 3 altered to include only half of the source width), with a first dual threshold voltage device (corresponding to the device of FIG. 5), and with a second dual threshold device (corresponding to the device of FIG. 5 but with different threshold voltages as shown). Parameters simulated include threshold voltage Vt1, threshold voltage Vt2, differential threshold voltage (ΔVt), temperature divergence (Tm divg), and source-drain on resistance ($R_{DS(on)}$). Temperature divergence refers to the maximum temperature divergence within each of the simulated devices. A higher value of temperature divergence is undesirable since high temperature divergence can designate "hot spots" within the device that can lead to thermal runaway and device destruction even though the device is operated within maximum current and voltage limits. Using the 50% $G_m$ device, Tm divergence is reduced to almost half that of the conventional design. However, $R_{DS(on)}$ increases significantly (about a 35% increase). Using the dual Vt approach as described herein, a similar Tm divergence reduction is realized with a negligible $R_{DS(on)}$ increase (<5%). FBSOA can therefore be improved with only a negligible impact on $R_{DS(on)}$. On higher voltage power devices, the $R_{DS(on)}$ increase is even smaller with a correspondingly improved FBSOA.

FIG. 17 is a table 1700 of experimental results for assessing the performance of segmented source devices according to embodiments. A conventional power device was measured with a safe drain current range of 2.7 to 3.3 amperes. A dual Vt stripe device (as shown in, for example, FIG. 5) was measured with a safe drain current range of 3.7 to 4.0 amperes. The corresponding drain-to-source on resistance $R_{DS(on)}$ was measured as 48 mΩ for both devices. A 100V P-channel lot of power devices was run with a dual Vt using stripe design (wherein each side has a different Vt source). The dual Vt design had a higher FBSOA capability (30% more) and also lower part to part variation (tighter range). The improvements to FBSOA capability were realized with no increase in $R_{DS(on)}$.

For example, a specific point on the FBSOA curve at high voltage is measured to determine the higher FBSOA capability. The drain voltage is set to Vd=80V, the duration of the test is set to t=10 ms, and drain failure current Id is found. The same test conditions are used for both designs, and many devices from each group are measured. The dual Vt design referred to above has a better (higher) Id or FBSOA and a lower part-to-part variation. An 80% rated maximum Vd represents the maximum voltage seen in some applications.

FIG. 18 is a plan view of a power device die 1800 showing radial variations of die thermal impedance. The die center 1802 of power device 1800 has the highest thermal impedance $R_{th}$ and the edges 1814 of power device 1800 have the lowest thermal impedance $R_{th}$. Die temperature is thus at a maximum in center zone 1802, and gradually decreases through intermediate zones 1804, 1806, 1808, and 1810. Die temperature is at a minimum in edge zone 1814. This distribution of thermal impedance leads to thermal instability and FBSOA failure near the center of the die. The ratio of the threshold voltages used in the source segments, as well as source segmentation itself, can be adjusted within each of the temperature zones in order to maximize FBSOA, which is described in further detail below.

Figure 19:
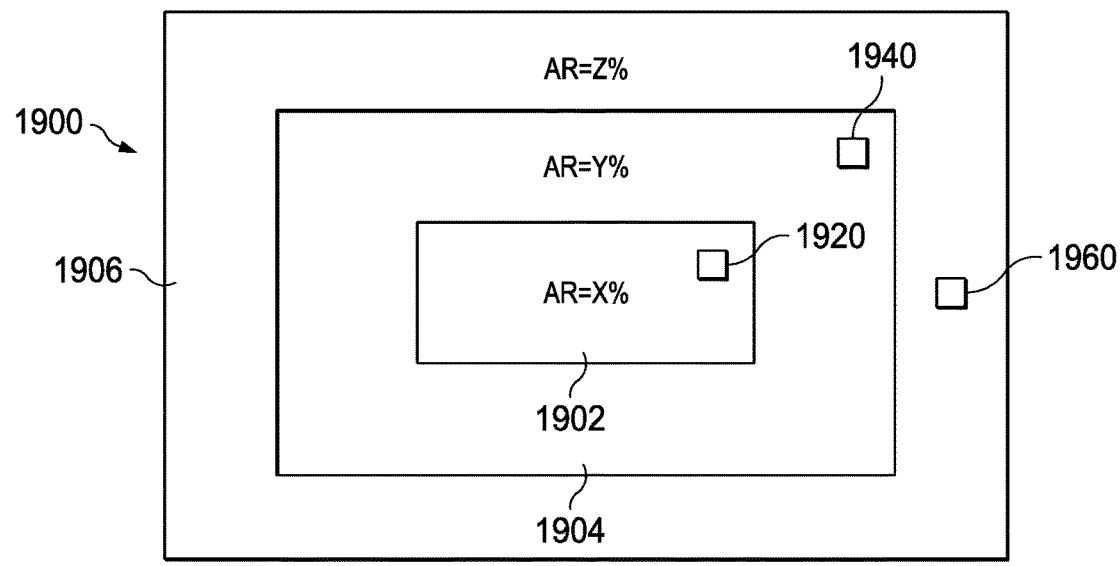
FIG. 19 is a plan view of a rectangular die layout schematic according to an embodiment, having a first source segment area ratio in an inner portion of the die, a second source segment area ratio in a middle portion of the die, and a third source segment area ratio in an outer portion of the die.

FIG. 19 is a plan view of a power device 1900 comprising rectangular radial variation of the ratio of the threshold voltage source segmentation according to an embodiment using concentric source segmentation zones, and more specifically using a plurality of rectangular concentric source segmentation zones. The power device 1900 includes a first zone 1902 including a plurality of devices 1920 having a first ratio of a first threshold voltage source segmentation to a second threshold voltage source segmentation. The threshold voltage source segmentation ratio can be realized within a cell as has been described, or can also be realized by using a mixture of cells 1920 having a first threshold voltage and cells 1920 having a second threshold voltage. The power device 1900 includes a second zone 1904 including a plurality of devices 1940 having a second ratio of a first threshold voltage source segmentation to a second threshold voltage source segmentation. The threshold voltage source segmentation ratio can be realized within a cell as has been described, or can also be realized by using a mixture of cells 1920 having a first threshold voltage and cells 1920 having a second threshold voltage. The power device 1900 includes a third zone 1906 including a plurality of devices 1960 having a third ratio of a first threshold voltage source segmentation to a second threshold voltage source segmentation. The threshold voltage source segmentation ratio can be realized within a cell as has been described, or can also be realized by using a mixture of cells 1920 having a first threshold voltage and cells 1920 having a second threshold voltage. Additional zones can be used. Zone 1902 may be configured to have more higher threshold cells 1920 than the higher threshold cells 1940 in zone 1904, and in turn, zone 1904 may be configured to have more higher threshold cells 1940 than the higher threshold cells 1960 in zone 1906, in order to make the temperature distribution more uniform across the entire device 1900.

As previously discussed, the power device die 1900 has an inherent thermal resistance (Rth) variation from center to edge with center having higher Rth. This variation causes the center of the die to be hotter and the non-uniform temperature distribution on the die reduces the maximum FBSOA capability. The non-uniform temperature distribution can be compensated using different threshold voltage source segment ratios in zone to match the temperature distribution so that the maximum FBSOA can be improved.

The center area or zone 1902 can use a higher Vt area ratio (AR) to reduce the device current flow in this zone during the FBSOA. This matching of the Vt area ratio to the highest temperature zone keeps the center zone 1902 cooler, thus improving FBSOA capability. The ratio is gradually decreased in concentric zones towards the die edges to achieve a more uniform temperature across the whole die. Zone 1904 thus has a medium Vt area ratio, and zone 1906 has the lowest Vt area ratio. Source segmentation can also be used in conjunction with the adjustment in Vt area ratios to further improve FBSOA capability. The improvement in FBSOA using Vt area ratios is given in the equations below:

wherein AR=the area ratio of the total source segment area of a first source S1 having a first threshold voltage Vt1 to the total source segment area of a second source segment S2 having a second threshold voltage Vt2, wherein Vt1 of S1>Vt2 of S2, and wherein the area ratio of zone 1902 "X">=the area ratio of zone 1904 "Y">=the area ratio of zone 1906 "Z".

In the example of FIG. 19, a three step variation is shown, including rectangular zones 1902, 1904, and 1906. Additional or fewer zones can be used. A gradual decrease in the Vt area ratio using additional zones more effectively cancels out the Rth decrease on the die.

Figure 20:
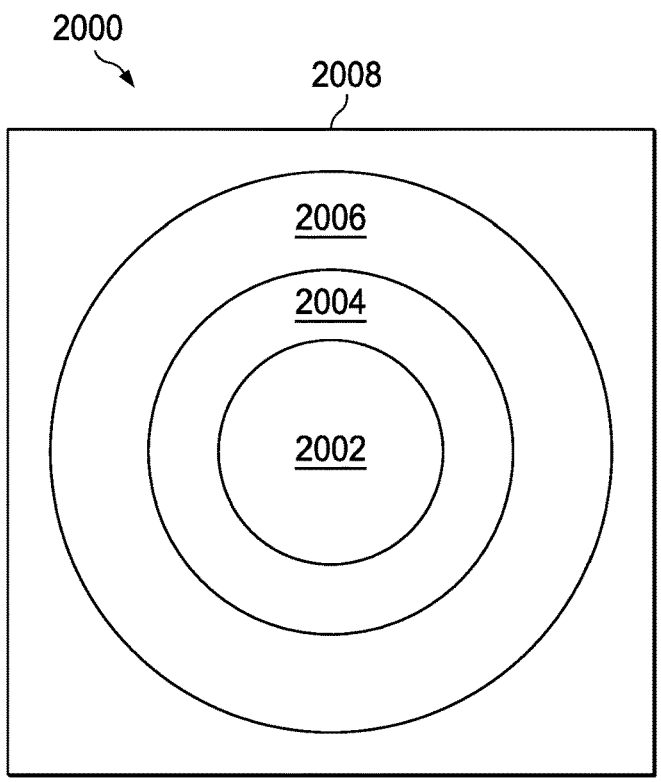
FIG. 20 is a plan view of a power device die comprising a circular radial variation of the source segmentation ratio according to an embodiment.

FIG. 20 is a plan view of a power device 2000 comprising a circular radial variation of the Vt area ratio and/or source segmentation according to an embodiment. Circular concentric Vt area ratio and/or source segmentation zones 2002, 2004, 2006, and 2008 are shown, all including a plurality of device cells. Source segmentation zone 2002 includes the greatest ratio of high threshold voltage source area to low threshold voltage source area, zone 2004 includes the next greatest ratio of high threshold voltage source area to low threshold voltage source area, zone 2006 includes the next greatest ratio of high threshold voltage source area to low threshold voltage source area, and zone 2008 includes the lowest ratio of high threshold voltage source area to low threshold voltage source area. In this way, the temperature distribution across the device 2000 can be made more uniform, and the FBSOA of device 2000 can be maximized.

The Vt area ratio and/or source segmentation percentage is varied from the center of the die (zone 2002) to the edge of the die (zone 2008). The maximum Vt area ratio is in the center zone 2002, and increases to a minimum Vt area ratio in the edge zone 2008. The circular radial variation of the Vt area ratio shown in FIG. 20 may more closely track thermal variations in actual power devices than the rectangular variation shown in FIG. 19.

Figure 21:
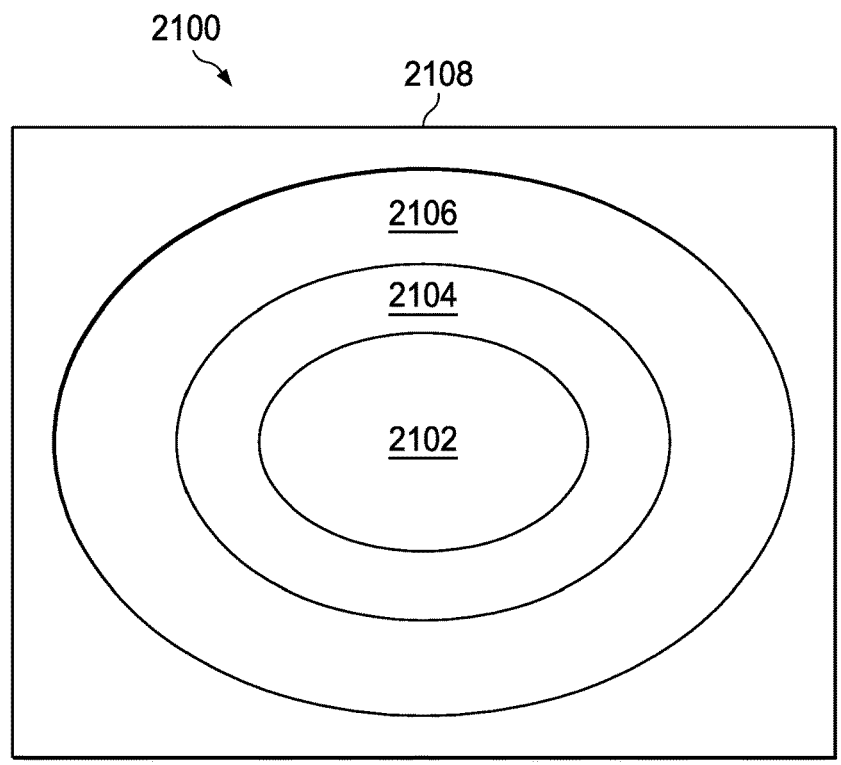
FIG. 21 is a plan view of a power device die comprising an oval radial variation of the source segmentation ratio according to an embodiment.

FIG. 21 is a plan view of a power device 2200 comprising an oval radial variation of the Vt area ratio and/or source segmentation according to an embodiment. Oval concentric Vt area ratio and/or source segmentation zones 2102, 2104, 2106, and 2108 are shown. Each zone includes a plurality of cells having different source threshold voltages as previously described with respect to FIGS. 19 and 20. The Vt area ratio and/or source segmentation percentage is varied from the center of the die (zone 2102) to the edge of the die (zone 2108). The maximum Vt area ratio is in the center zone 2102, and increases to a minimum Vt area ratio in the edge zone 2108. The oval radial variation of the Vt area ratio shown in FIG. 21 may more closely track thermal variations in actual power devices than the rectangular variation shown in FIG. 20.

In FIGS. 19, 20, and 21 the segmented sources having differing threshold voltage source segments can comprise checkered sources, laddered sources, or cellular sources, or any combinations thereof. The type of segmented sources and the Vt area ratio thereof can be the same in a plurality of concentric zones, or can be varied from one zone to another, or even within a single zone as may be required for a specific implementation. The Vt area ratio within a zone can be realized by using segmented sources within a cell, or a mixture of first and second cells, wherein a first cell has a corresponding first threshold voltage and a second cell has a corresponding second threshold voltage, or a combination of any of these cells to effect a ratio of source segments having different threshold voltages within a zone as desired.

For more complicated embodiments having four source segments each having a corresponding threshold voltage, a source segment ratio can be calculated in various ways for use in the concentric zones described above. For example, if A1 is the total area of the first threshold segments having a threshold voltage of Vt1, A2 is the total area of the second threshold segments having a threshold voltage of Vt2, A3 is the total area of the third threshold segments having a threshold voltage of Vt3, and A4 is the total area of the fourth threshold segments having a threshold voltage of Vt4, the following relevant equations can be used.

For example, the following two sets of equations can be used, but many other such equations can be used as will be apparent to those skilled in the art:

$$A1=A2=A3=A4; Vt1>Vt2>Vt3>Vt4 \quad \quad 1.$$

$$A1/A2=K12, A2/A3=K23, A3/A4=K34;$$
$$Vt1>Vt2>Vt3>Vt4 \quad \quad 2.$$

$$K12=K23=K34<1 \quad \quad (a)$$

$$K12<K23<K34 \quad \quad (b)$$

$$K12<K23<K34<1] \quad \quad (c)$$

According to embodiments described herein, the FBSOA of power devices may be improved without a significant increase in $R_{DS(on)}$ or without the need for other tradeoffs. In other words, the use of multiple Vt source segments as described achieves an improvement in FBSOA as well as an acceptable $R_{DS(on)}$ in the same power device. The area ratios of multiple Vt source segments can be varied to tune the FBSOA within a power device. The area ratio can be varied geographically on the die within concentric zones as well to compensate inherent thermal resistance variation, for example the center of the die could have higher Vt area ratio than edges of the die. Dual (or multiple) Vt source segments can be achieved using various methods described herein. In some embodiments Vt source segments may be uniformly distributed to promote a more uniform temperature distribution. A ΔVt of about 10-30% is recommended for the best tradeoff between FBSOA and $R_{DS(on)}$. Values outside of this range could also be used based on the requirements of a specific application. The multiple Vt source segments and other source segmentation embodiments described herein can be easily combined with other known FBSOA improvement techniques to achieve additional benefits.

While certain values and ranges for threshold voltages, area ratios, and other features of described embodiments have been given, it will be apparent to those skilled in the art that these values and ranges can be changed to accommodate specific implementations and applications.

It will thus be apparent to those skilled in the art that device structures including source segmentation including differing threshold voltages and threshold voltage ratios as described herein can be extended to any other power device structure such as planar, trench, vertical, and charge balanced devices and also various device types including MOSFET, Insulated Gate Bipolar Transistors ("IGBT"), and Injection-Enhanced Gate Transistor ("IEGT") devices. The examples listed immediately above are not meant to be limiting.

It has been shown and described herein that using dual (or multiple) Vt segments, a low $G_m$ for maximizing FBSOA has been achieved during a first set of operational conditions, and a high $G_m$ for minimizing $R_{DS(on)}$ has also been achieved during a second set of operational conditions. If these segments of low and high Vt are distributed uniformly throughout the die as described herein, then FBSOA can be improved without increasing $R_{DS(on)}$.

A variety of different techniques and processes can be used to achieve different Vt device segments. For example, device characteristics of the sources of the device can be differently modified to achieve different Vt device segments. However, the device characteristics of other portions of the device such as the channel and the gate either separately, or in conjunction with, the sources can be differently modified to achieve different Vt device segments. The Vt device segments can be used in a mixture of different type Vt segments in a single device. Alternatively, the Vt device segments can all comprise a first type in a first device, and can all comprise a second type in a second device, wherein a power device includes a mixture of the first and second devices. The different Vt device segments formed by the different techniques and process described below can be applied to any of the device configurations described herein.

One process for fabricating dual Vt segments on DMOS devices is to use two different source diffusions. A wide source diffusion in a first segment provides a lower Vt than a narrow source diffusion in a second segment. Another approach is to use higher source doses and/or lower channel doses in some segments to achieve a lower Vt. A Vt adjust implant using a segmented mask can also be used to adjust Vt in selected areas. P or N type dopant Vt adjust implants can also be used to increase or decrease Vt.

Depending on the device, other techniques can also be used to achieve multiple Vt segments. For example, multiple gate oxide thicknesses, angled implants, segmented spacers, different gate electrodes, different gate dielectrics, and other such techniques can be used. All of these techniques applied to the device configurations described herein employ multiple Vt segments for advantageously improving FBSOA without a substantial increase in $R_{DS(on)}$, as is described in further detail below.

Figure 22:
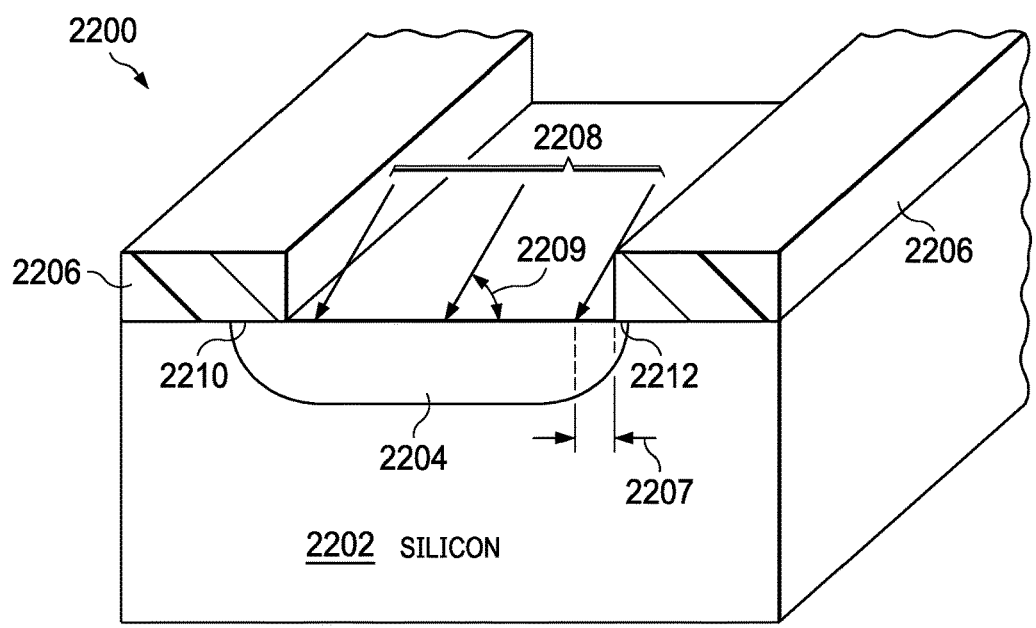
FIG. 22 is a three-quarters view of a power device receiving an angled source implant according to an embodiment.

FIG. 22 is a three-quarters view of a power device 2200 receiving an angled source implant 2208 according to an embodiment. Power device 2200 includes a silicon or other substrate 2202, a source 2204, and a source defining mask 2206. The source implant is angled at an angle 2209 different than normal (90°) from a surface of source 2204. For example, the source implant angle 2209 can range from 0° to 45°, for example 20°, in an embodiment. Other angles outside of this range can be used with an appropriate implant tool. Angling the source implant 2208 will result in a source implant having a greater lateral excursion 2210 underneath the leftmost portion of mask 2206 and a lesser lateral excursion 2212 underneath the rightmost portion of mask 2206. In an embodiment, source 2204 can be used to form two source segments corresponding to two Vt segments—one with a relatively higher Vt and one with a relatively lower Vt. This dual Vt device is used and described below with respect to FIGS. 23A, 23B and 23C, according to an embodiment.

In an embodiment, an angled channel implant can also be used to form different Vt segments using an angled channel implant and a channel defining mask similar to the angled source implant and source defining mask described above and shown in FIG. 22. The angled source implant and the angled channel implant can be combined in an embodiment.

FIGS. 23A through 33 illustrate plan views and corresponding cross-sectional views of a plurality of devices having different threshold voltage segments using various techniques, according to embodiments. In FIGS. 23A through 33 any source segment plan view previously illustrated can be used. The cross-sectional views are used to illustrate the mechanism by which the threshold voltages are modified, which can include modifying the sources, the channels, and the gate of the device, according to embodiments.

FIG. 23A illustrates a plan view of a power device 2300 receiving an angled source implant 2312, and FIGS. 23B and 23C cross-sectional views of the power device 2300 after having received the angled source implant. Power device 2300 includes a first polysilicon gate 2302A and a second polysilicon gate 2302B. The cross-sectional view of power device 2300 through line AA' shows a source 2304A, a channel 2308A, and a drain 2310. The cross-sectional view of power device 2300 through line BB' shows a source 2304B, a channel 2308B, and the drain 2310. The left side (AA') of device 2300 has a lower Vt as the angled implant 2312 extends the source 2304A further under the polysilicon gate 2302A. The right side (BB') of device 2300 has a higher Vt as the angled implant 2312 is shadowed and less of the source 2304B extends under the polysilicon gate 2302B. The difference 2306 between the lateral dimensions of sources 2304A and 2304B is also shown in FIGS. 23B and 23C. In the example of FIG. 23B, the source 2304A, 2304B is asymmetrical with respect to the gates 2302A and 2302B. In the example of FIG. 23B, a dual Vt device is thus shown. The ΔVt between the two Vt segments increases with an increasing implant angle deviation from normal (90°). In an embodiment, a power device having an improved FBSOA can therefore comprise a plurality of first and second Vt segments both having been implanted by the angled implant 2312, but having different threshold voltages. In an embodiment, an existing process flow for the power device could be used and only the angle of the implant tool need be changed. In an embodiment, the total source area (comprising two Vt segments) is asymmetrical with respect to polysilicon gates 2302A and 2302B. In a conventional device (using a normal implant) the total source area is symmetrical with respect to polysilicon gates 2302A and 2302B, even if two different Vt segments are used. In other words, devices having sources formed with a normal implant will exhibit source symmetry with respect to the gate or gates, and devices having sources formed with an angled implant will exhibit source asymmetry with respect to the gate or gates. Devices having source segments formed with a normal implant will exhibit source segment symmetry with respect to the gate or gates, and devices having source segments formed with an angled implant will exhibit source segment asymmetry with respect to the gate or gates.

Device 2300 thus comprises a gate 2302A, 2302B, and a segmented source 2304A, 2304B proximate to the gate 2302A, 2302B, wherein the segmented source 2304A, 2304B comprises a plurality of first segments 2304A associated with a first threshold voltage and a plurality of second segments 2304B associated with a second threshold voltage different from the first threshold voltage, wherein at least one device characteristic (source width) associated with the plurality of first segments 2304A is different from the at least one device characteristic (source width) associated with the plurality of second segments 2304B.

In an embodiment, device 2300 is fabricated by forming a gate 2302A, 2302B, and forming a segmented source 2304A, 2304B proximate to the gate 2302A, 2302B.

The method of changing the at least one device characteristic (source width) comprises forming the plurality of first segments 2304A using an angled source implant 2312, and forming the plurality of second segments 2304B also using the angled source implant 2312. The method of forming the first and second Vt segments can be performed simultaneously as is also shown in step 3704C of FIG. 37 with respect to a generalized method of forming a device having improved FBSOA.

FIG. 24A illustrates a plan view of a power device 2400 and a spacer etch mask 2412, and FIG. 24B illustrates cross-sectional views of the power device 2400 after having received a source implant using the spacer etch mask 2412. The spacer etch mask 2412 is used for selecting removing source spacers such as source spacer 2407 for selectively controlling the lateral dimensions of the sources. Power device 2400 includes a first polysilicon gate 2402A and a second polysilicon gate 2402B. The cross-sectional view of power device 2400 through line AA' shows a source 2404A, a channel 2408A, and a drain 2410. The cross-sectional view of power device 2400 through line BB' shows a source 2404B, a channel 2408B, and the drain 2410. The left side (AA') of device 2400 has a lower Vt as the spacer is removed from this portion of the device. The right side (BB') of device 2400 has a higher Vt as the spacer shifts the source implant to the left. The difference 2406 between the lateral source dimensions is also shown in FIG. 24B. The source-channel junction doping is lower for source 2404A than for source 2404B. In the example of FIG. 24B a dual Vt device 2400 is shown, including two Vt segments each having their own different Vt. Various other patterns of spacer etch mask could be used to create a ΔVt difference when compared to a device not using the spacer etch mask. In an embodiment, FBSOA can be improved by a device comprising a plurality of segments using the spacer etch mask and a plurality of segments not using the spacer etch mask.

Device 2400 thus comprises a gate 2402A, 2402B; and a segmented source 2404A, 2404B proximate to the gate 2402A, 2402B, wherein the segmented source 2404A, 2404B, comprises a plurality of first segments 2404A associated with a first threshold voltage and a plurality of second segments 2404B associated with a second threshold voltage different from the first threshold voltage, wherein at least one device characteristic (source width) associated with the plurality of first segments 2404A is different from the at least one device characteristic (source width) associated with the plurality of second segments 2404B.

In an embodiment, device 2400 is fabricated by forming a gate 2402A, 2402B, and forming a segmented source 2404A, 2404B proximate to the gate 2402A, 2402B.

The method of changing the at least one device characteristic (source width) comprises forming the plurality of first segments 2404A using a source spacer etch mask 2412, and forming the plurality of second segments 2404B without using the source spacer etch mask 2412. The method of forming the first and second Vt segments can be performed sequentially as is also shown in steps 3704A and 3704B of FIG. 37 with respect to a generalized method of forming a device having improved FBSOA.

FIG. 25A illustrates a plan view of a power device 2500 and a Vt adjustment implant mask 2512, and FIG. 25B illustrates cross-sectional views of the power device 2500 after having received a Vt adjustment implant. The Vt adjustment implant can comprise a P-type or N-type implant used to adjust the threshold voltage of a power device segment either higher or lower depending upon the dosage and type of dopant implant that is used. Power device 2500 includes a first polysilicon gate 2502A and a second polysilicon gate 2502B. The cross-sectional view of power device 2500 through line AA' shows a source 2504A, a channel 2508A, and a drain 2410, as well as a Vt adjust implant 2506 extending from source 2504A across channel 2508A to drain 2510 In an embodiment, the Vt adjust implant 2506 need not extend to drain 2510, but covers at least the source-channel junction. The cross-sectional view of power device 2500 through line BB' shows a source 2504B, a channel 2508B, and the drain 2510. The left side (AA') of device 2500 has a different Vt as it includes the Vt adjust implant 2506. The right side (BB') of device 2500 has a normal Vt as it does not include the Vt adjust implant 2506. In the example of FIG. 25B, a dual Vt is shown. Various other patterns of the Vt adjust mask 2512 such as checkered or ladder patterns as well as other patterns previously described could be used. In an embodiment, FBSOA can be improved by a device comprising a plurality of segments using the Vt adjust mask and a plurality of segments not using the Vt adjust mask.

Device 2500 thus comprises a gate 2502A, 2502B; and a segmented source 2504A, 2504B, proximate to the gate 2502A, 2502B, wherein the segmented source 2504A, 2504B, comprises a plurality of first segments (that can include at least an upper portion of channel 2508A, source 2504A, and drain 2510) associated with a first threshold voltage and a plurality of second segments (that can include at least a upper portion of channel 2508B, source 2504B, and drain 2510) associated with a second threshold voltage different from the first threshold voltage, wherein at least one device characteristic (channel doping) associated with the plurality of first segments (upper portion of channel 2508A, source 2504A, and drain 2510) is different from the at least one device characteristic (channel doping) associated with the plurality of second segments (upper portion of channel 2508B, source 2504B, and drain 2510).

In an embodiment, device 2500 is fabricated by forming a gate 2502A, 2502B, and forming a segmented source 2504A, 2504B proximate to the gate 2502A, 2502B.

The method of changing the at least one device characteristic (channel doping) comprises forming a channel 2508A proximate to the plurality of first segments using a threshold voltage adjust implant 2506, and forming a channel 2508B proximate to the plurality of second segments without using the threshold voltage adjust implant 2506. The method of forming the first and second Vt segments can be performed sequentially as is also shown in steps 3704A and 3704B of FIG. 37 with respect to a generalized method of forming a device having improved FBSOA.

While the above examples of FIGS. 23A and 23B modify source width, and the example of FIG. 25B modifies channel doping density in order to change the Vt of the corresponding device Vt segments, there are many other ways to form multiple Vt segments. For example, different gate oxide thickness can be used in different device areas. One way this is achieved is by selectively etching the gate oxide from some areas of the device and then growing it again. Another way multiple Vt segments are achieved is to form dual channel implants with different doses and/or drives for different device areas. Using materials with different work functions to make different gate areas can be used for forming the multiple Vt segments. For example, alternate gate stripes or segments could be made of N+ and P+ polysilicon. These methods are described in further detail below.

Figure 26:
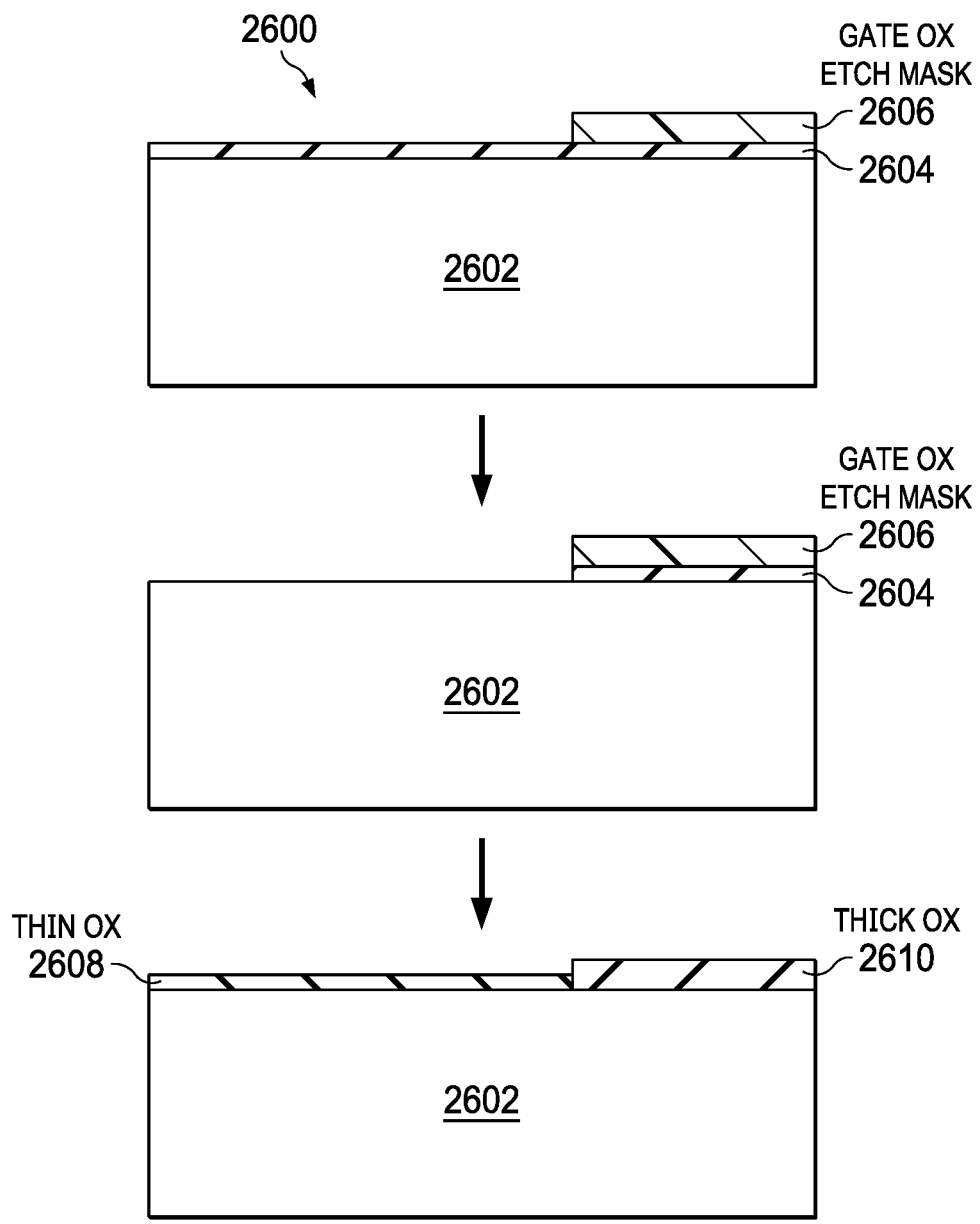
FIG. 26 illustrates sequential cross-sectional views for forming a thin oxide layer, and a thick oxide layer on a power device using a gate oxide etch mask.

FIG. 26 illustrates sequential cross-sectional views for forming a thin oxide layer, and a thick oxide layer on a power device using a gate oxide etch mask. A device 2600 receives an initial gate oxidation, and a uniform thickness oxide 2604 grows on substrate 2602. A gate oxide mask 2606 is used to selectively etch away gate oxide from the left side of device 2600. The mask 2606 is then removed and device 2600 is subjected to a second gate oxidation. During the second gate oxidation, gate oxide is grown on the left side of device 2600 while the right side of device 2600 also receives the same oxidation. As a consequence, the right side of device 2600 comprises a thicker gate oxide 2610 than the thinner gate oxide 2608 associated with the left side of device 2600. Gate oxide 2610 is thicker as it is formed of two gate oxidations, while gate oxide 2608 is thinner as it is formed of only one gate oxide.

FIG. 27A illustrates a plan view of a power device 2700 and a gate oxide etch mask 2712, and FIG. 27B illustrates cross-sectional views of the power device 2700 showing a thin oxide layer 2706A and a thick oxide layer 2706B formed using the gate oxide etch mask 2712. Power device 2700 includes a first polysilicon gate 2702A and a second polysilicon gate 2702B. The cross-sectional view of power device 2700 through line AA' shows a source 2704A, a channel 2708A, and a drain 2710, as well as a thin oxide layer 2706A. The cross-sectional view of power device 2700 through line BB' shows a source 2704B, a channel 2708B, and the drain 2710, as well as a thick oxide layer 2706B. The left side (AA') of device 2700 has the initial gate oxide etched away. Then during a second gate oxidation, a thinner gate oxide is grown. The right side (BB') of device 2700 has a thicker gate oxide 2706B as it is formed from two gate oxidations instead of one. No further etching is required to generate the two oxide thicknesses. Various other patterns of the gate etch mask can be used. For example, checkered and ladder patterns can be used. In an embodiment, FBSOA can be improved by a device comprising a plurality of Vt segments using the gate oxide mask and a plurality of Vt segments not using the gate oxide mask.

Device 2700 thus comprises a gate 2702A, 2702B; and a segmented source 2704A, 2704B proximate to the gate 2702A, 2702B, wherein the segmented source comprises a plurality of first segments (that can include at least the thin gate oxide layer 2706A over channel 2708A) associated with a first threshold voltage and a plurality of second segments (that can include at least the thick gate oxide layer 2706B over channel 2708B) associated with a second threshold voltage different from the first threshold voltage, wherein at least one device characteristic (gate oxide thickness) associated with the plurality of first segments is different from the at least one device characteristic (gate oxide thickness) associated with the plurality of second segments.

In an embodiment, device 2700 is fabricated by forming a gate 2702A, 2702B, and forming a segmented source 2704A, 2704B proximate to the gate 2702A, 2702B.

The method of changing the at least one device characteristic (gate oxide thickness) comprises forming a thick gate oxide 2706B over a channel 2708B proximate to the plurality of first segments, and forming a thin gate oxide 2706A over a channel 2708A proximate to the plurality of second segments. The method of forming the first and second Vt segments can be performed sequentially as is also shown in steps 3704A and 3704B of FIG. 37 with respect to a generalized method of forming a device having improved FBSOA.

In addition to modifying gate oxide thickness to form different Vt segments, channel doping in different areas of the device can also be used to form different Vt segments. Different Vt segments can be formed because Vt is proportional to channel doping. Several different methods can be used for modifying channel doping. One method is to use a first implant dose in one area of the channel and to use a second implant dose in second area of the channel. The two different implants will correspondingly create two different threshold voltage segments. Another method is to use a normal channel dose in all channel areas, and then using a top off channel dose in areas where a higher Vt is desired. Channel drive can also be used to create different channel doping. A longer drive results in a lower Vt. In this case, the channel is implanted in one area only and driven first. Then the channel is implanted (with the same or a different dose) in remaining areas and driven again. The first area receives two drives and will have a lower Vt. The second area receives only one drive and will have a higher Vt. These methods of modifying the channel to create different Vt segments are explained in further detail below.

FIG. 28A is illustrates a plan view of a power device 2800 and a channel top-off mask 2812, and FIG. 28B illustrates cross-sectional views of the power device 2800 showing a normal channel 2806B and a heavier doped channel 2806A after using the channel top-off mask. Power device 2800 includes a first polysilicon gate 2802A and a second polysilicon gate 2802B. The cross-sectional view of power device 2800 through line AA' shows a source 2804A, a heavier doped channel 2808A, and a drain 2810. The cross-sectional view of power device 2800 through line BB' shows a source 2804B, a normally doped channel 2808B, and the drain 2810. The left side (AA') of device 2800 receives an extra channel implant, which will result in a higher Vt in this portion of the device. The right side (BB') of device 2800 receives the normal channel implant, which will result in the normal Vt in this portion of the device. Various other patterns of channel mask like checkered and ladder patterns can be used. In an embodiment, FBSOA can be improved by a device comprising a plurality of Vt segments using the channel top off mask and a plurality of Vt segments not using the channel top off mask.

Device 2800 thus comprises a gate 2802A, 2802B; and a segmented source 2804A, 2804B proximate to the gate, wherein the segmented source 2804A, 2804B comprises a plurality of first segments (including at least a heavily doped upper portion of channel 2806A) associated with a first threshold voltage and a plurality of second segments (including at least a normally doped upper portion of channel 2806B) associated with a second threshold voltage different from the first threshold voltage, wherein at least one device characteristic (channel doping density) associated with the plurality of first segments is different from the at least one device characteristic (channel doping density) associated with the plurality of second segments.

In an embodiment, device 2800 is fabricated by forming a gate 2802A, 2802B, and forming a segmented source 2804A, 2804B proximate to the gate 2802A, 2802B.

The method of changing the at least one device characteristic (channel doping density) comprises forming a channel 2808A proximate to the plurality of first segments using a channel top-off mask 2812, and forming a channel 2808B proximate to the plurality of second segments without using the channel top-off mask 2812. The method of forming the first and second Vt segments can be performed sequentially as is also shown in steps 3704A and 3704B of FIG. 37 with respect to a generalized method of forming a device having improved FBSOA.

FIG. 29A illustrates a plan view of a power device 2900, a first channel mask 2912A, and a second channel mask 2912B, and FIG. 29B illustrates cross-sectional views of the power device 2900 showing a normal channel 2908B and a deeper channel 2908B using the first and second channel masks. Power device 2900 includes a first polysilicon gate 2902A and a second polysilicon gate 2902B. The cross-sectional view of power device 2900 through line AA' shows a source 2904A, a deeper channel 2908A, and a drain 2910. The cross-sectional view of power device 2900 through line BB' shows a source 2904B, a normal channel 2908B, and the drain 2910. The left side (AA') of device 2900 receives the first channel mask 2912A, a first implant and a first drive. The left side of device 2900 receives two drives, and so the corresponding Vt will be lower on that side of the device. The right side (BB') of device 2900 receives the second channel mask, a second implant and a second drive. The left side of device 2900 receives only one drive and hence has a higher Vt on that side of the device. Various other patterns of channel masks like checkered and ladder patterns can be used. In an embodiment, FBSOA can be improved by a device comprising a plurality of Vt segments using the first channel mask and a plurality of Vt segments using the second channel mask.

Device 2900 thus comprises a gate 2902A, 2902B; and a segmented source 2904A, 2904B proximate to the gate, wherein the segmented source 2902A, 2902B comprises a plurality of first segments (including at least channel 2908A having a first depth or thickness) associated with a first threshold voltage and a plurality of second segments (including at least channel 2908B having a second depth or thickness) associated with a second threshold voltage different from the first threshold voltage, wherein at least one device characteristic (channel drive) associated with the plurality of first segments is different from the at least one device characteristic (channel drive) associated with the plurality of second segments.

In an embodiment, device 2900 is fabricated by forming a gate 2902A, 2902B, and forming a segmented source 2904A, 2904B proximate to the gate 2902A, 2902B.

The method of changing the at least one device characteristic (channel drive) comprises forming a channel 2908B proximate to the plurality of first segments using a first channel mask 2912A, and forming a channel 2908B proximate to the plurality of second segments using a second channel mask 2912B. The method of forming the first and second Vt segments can be performed sequentially as is also shown in steps 3704A and 3704B of FIG. 37 with respect to a generalized method of forming a device having improved FBSOA.

FIG. 3oA illustrates a plan view and FIG. 30B illustrates cross-sectional views of a power device 3000 including a first gate 3002A and a second gate 3002B having different work functions. In the example of FIG. 30B the gate material work function is changed to change the Vt in the corresponding Vt segments. For example, gate 3002A can comprise a P+ type doped polysilicon gate, whereas gate 3002B can comprise an N+ type doped polysilicon gate. Power device 3000 includes a first polysilicon gate 3002A and a second polysilicon gate 2902B. The cross-sectional view of power device 3000 through line AA' shows a source 3004A, a channel 3008A, and a drain 2910. The cross-sectional view of power device 3000 through line BB' shows a source 3004B, a channel 3008B, and the drain 2910. In FIG. 3oB polysilicon gate 3002A receives a P+ implant, whereas polysilicon gate 3002B receives an N+ implant. Using the different work functions based on the two types of doped gate materials, there will be a fixed ΔVt of (e.g. ~1V for Si) between the two sides. Other materials may result in a different ΔVt. In an embodiment, device 3000 can comprise a dual Vt device having a first Vt segment associated with gate 3002A, and a second Vt segment associated with gate 3002B. Various other patterns of gate material can be used such as checkered or ladder patterns, as well as other patterns described herein.

Device 3000 thus comprises a gate 3002A, 3002B, and a segmented source 3004A, 3004B proximate to the gate 3002A, 3002B, wherein the segmented source 3004A, 3004B comprises a plurality of first segments (including at least gate 3002A) associated with a first threshold voltage and a plurality of second segments (including at least gate 3002B) associated with a second threshold voltage different from the first threshold voltage, wherein at least one device characteristic (gate work function or gate material) associated with the plurality of first segments is different from the at least one device characteristic (gate work function or gate material) associated with the plurality of second segments.

In an embodiment, device 3000 is fabricated by forming a gate 3002A, 3002B, and forming a segmented source 3004A, 3004B proximate to the gate 3002A, 3002B.

The method of changing the at least one device characteristic (gate work function or gate material) comprises forming a first gate portion 3002A proximate to the plurality of first segments, forming the first gate portion with a first work function or material, forming a second gate portion 3002B proximate to the plurality of second segments, and forming the second gate portion with a second work function or material different from the first work function. The method of forming the first and second Vt segments can be performed sequentially as is also shown in steps 3704A and 3704B of FIG. 37 with respect to a generalized method of forming a device having improved FBSOA.

Figure 31B:
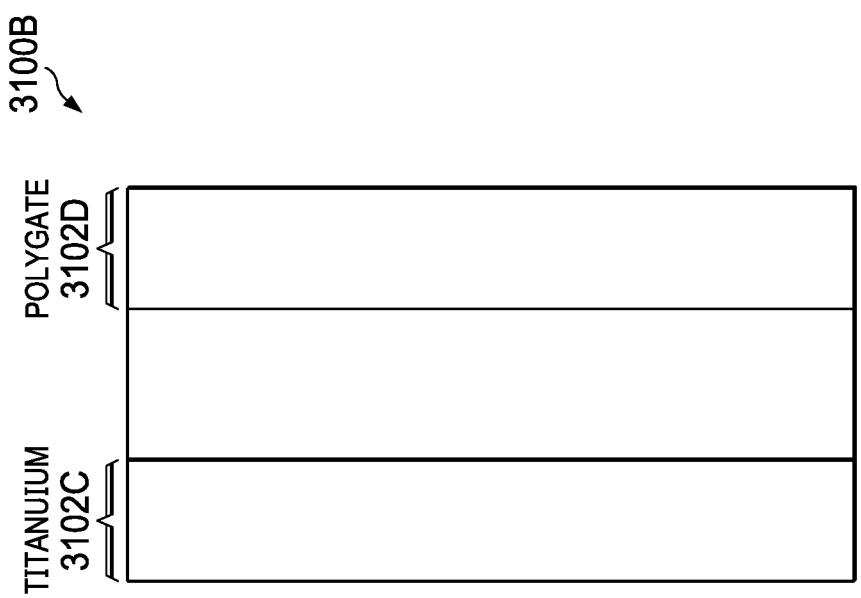
Figure 31A:
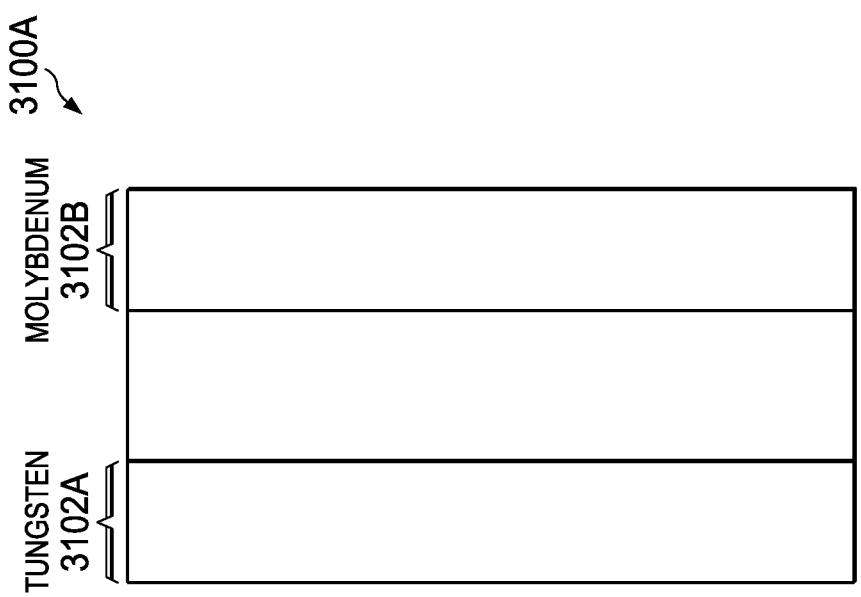

FIGS. 31A and 31B illustrate plan views of a power device including gates having different work functions. In this method, using various materials for the gate include polysilicon, tungsten, molybdenum, as well as many other such materials. Using different gate for a single Vt segment, for example, a different ΔVt can be achieved. Device 3100A includes a first gate 3102A comprising Tungsten and a second gate 3102B comprising Molybdenum. In an embodiment, device 3100A can comprise a dual Vt device, wherein gate 3102A is associated with a first Vt segment, and wherein gate 3102B is associated with a second Vt segment. Device 3100B includes a first gate 3102C comprising Titanium and a second gate 3102D comprising polysilicon. In an embodiment, device 3100B can comprise a dual Vt device, wherein gate 3102C is associated with a first Vt segment, and wherein gate 3102D is associated with a second Vt segment. Various other patterns of gate materials can be used such as checkered and ladder patterns, and other patterns described herein.

Various techniques for changing the Vt of one or more Vt segments have been shown and described. Many of these techniques can be combined if desired to achieve a greater ΔVt between Vt segments, and are described in further detail below with respect to FIGS. 32A and 32B (angled implant and different channel implants are combined in a single device) and FIGS. 33A and 33B (different source implants and use of Vt adjust implant are combined in a single device). Methods wherein at least two device characteristics associated with the plurality of first segments being different from the at least two device characteristics associated with the plurality of second segments are therefore shown in FIGS. 32A and 32B and FIGS. 33A and 33B and described in further detail below. Many other such combined examples can be constructed, by combining previously described single device characteristic embodiments.

Figure 32B:
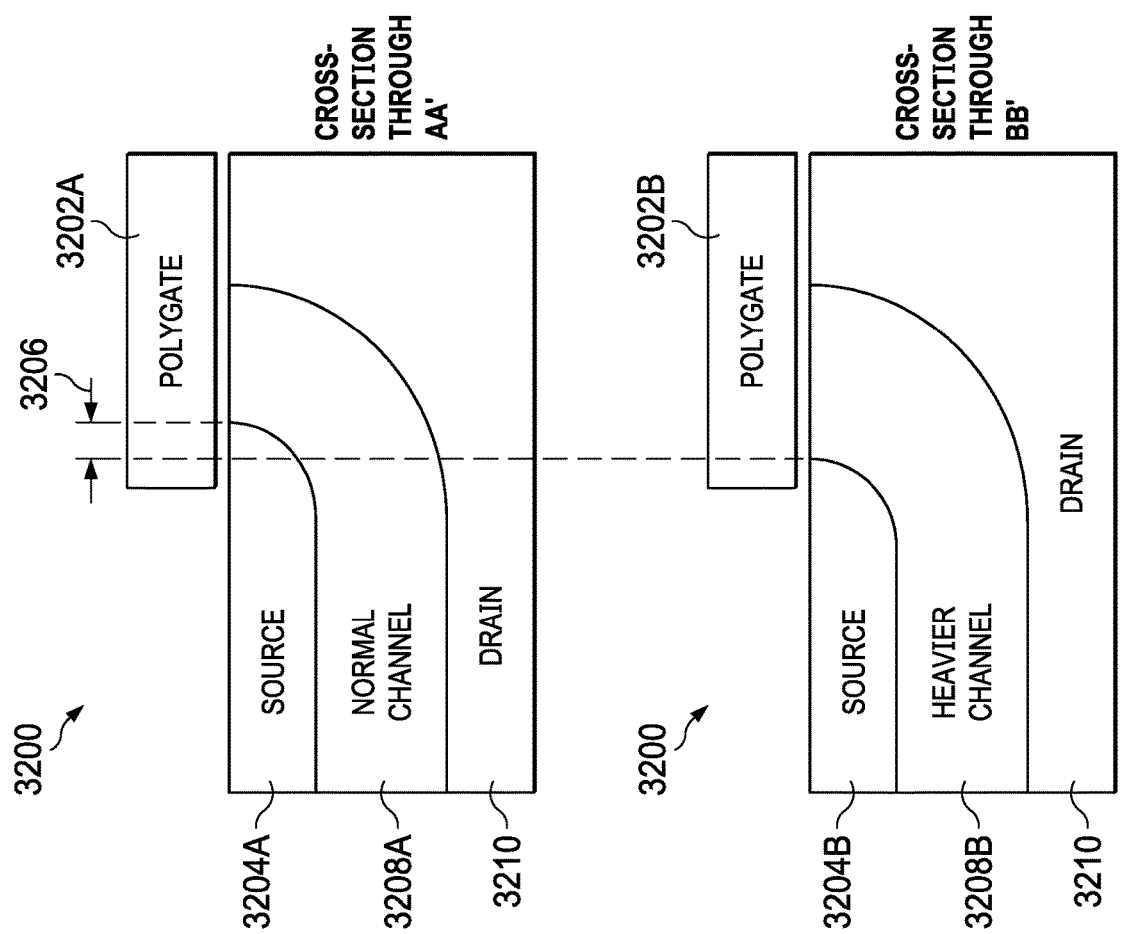
FIG. 32B illustrates cross-sectional views of the power device after having received the angled source implant as well as different channel implants.
Figure 32A:
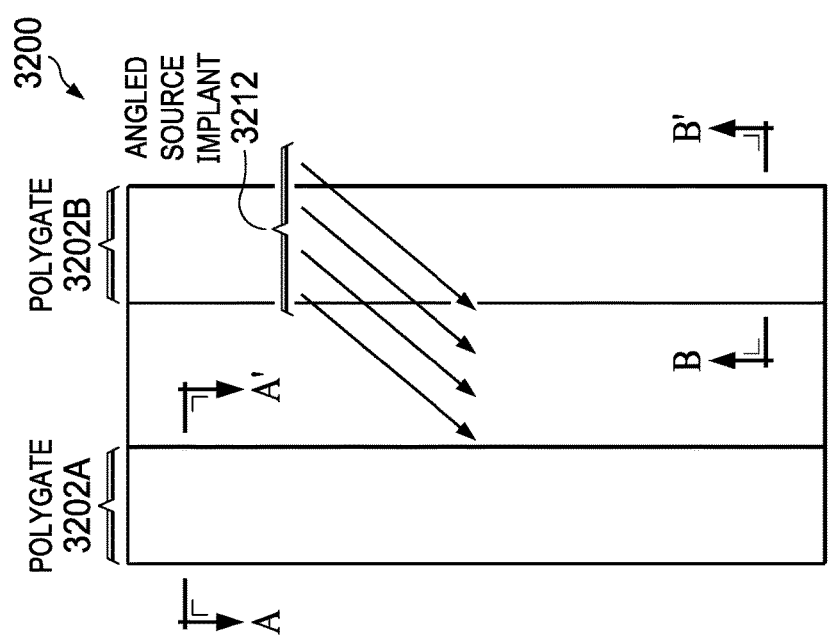
FIG. 32A illustrates a plan view of a power device receiving an angled source implant.

FIG. 32A illustrates a plan view of a power device 3200 receiving an angled source implant 3212, and FIG. 32B illustrates cross-sectional views of the power device 3200 after having received the angled source implant 3212 as well as different channel implants. Power device 3200 includes a first polysilicon gate 3002A and a second polysilicon gate 2902B. The cross-sectional view of power device 3000 through line AA' shows a source 3204A, a channel 3208A, and a drain 3210. The cross-sectional view of power device 3200 through line BB' shows a source 3204B, a channel 3208B, and the drain 3210. The left side (AA') of device 3200 has a lower Vt as angled implant 3212 extends further under the polysilicon gate 3202A. The right side (BB') of device 3200 has a much higher Vt as angled implant 3212 is shadowed and less of it extends under the polysilicon gate 3202B. The width difference 3306 between the lateral dimensions of the sources is also shown in FIG. 32B. In addition, the right side of device 3200 also has a heavier channel implant. Combining both of these methods (angled implant and heavier channel), the ΔVt of the Vt segment can be increased. Various other patterns like checkered and ladder patterns can also be used.

FIG. 33A illustrates a plan view of a power device 3300 including a Vt adjust implant mask 3312, and FIG. 33B cross-sectional views of the power device 3300 after receiving different source implants and a Vt adjust implant using the Vt adjust implant mask 3312. The plan view of device 3300 shows a first gate 3302A, a second gate 3302B, a first source 3304A and a second source 3304B. The cross-sectional view through line AA' shows source 3304A, channel 3308A, and drain 3310. The cross-sectional view through line BB' shows source 3304B, channel 3308B, Vt adjust implant 3307, and drain 3310. The difference 306 between the lateral dimensions of source 3304A and source 3304B is also shown. In the example of FIG. 33B, source 3304A (AA') is implanted first and goes through a single source drive. Then, source 3304B (BB') is implanted and another source drive is done. Source 3304A receives two source drives and diffuses further, and will therefore have a lower Vt than source 3304B. Also, the channel 3308B adjacent to source 3304B receives the Vt adjust implant 3307 to also increase Vt. Therefore, the Vt associated with source 3304B is much higher than the Vt associated with source 3304A. Combining the two methods (different source drives, and Vt adjust implant) advantageously provides a higher ΔVt.

Additional combinational embodiments may use transistors having segmented sources with less than 100% total available source area as well as any of the multiple Vt techniques described herein. In an example, a laddered or checkered source transistor having segmented sources with less than 100% total available source area (for example 50% of the total available source area) can be used with the angled source implant technique. FIGS. 8 and 11 also show examples of transistors with sources using less than 100% of the total available source area. Numerous additional examples of transistors having segmented sources referred to above are also described in detail in co-pending U.S. patent application Ser. No. 16/167,915 filed on Oct. 23, 2018, entitled "Increasing Forward Biased Safe Operating Area by Source Segmentation", which is hereby incorporated by reference in its entirety.

FIG. 34 is a table 3400 of simulation results based on a conventional design wherein all of the Vt segments are the same, a 50% $G_m$ design wherein for example half of the sources are removed in a single-side design, a dual Vt segment design with a low $\Delta Vt$, and a dual Vt segment with a high $\Delta Vt$. The simulated categories are Vt1 (the Vt associated with a first Vt segment), Vt2 (the Vt associated with a second Vt segment), $\Delta Vt$ (the Vt difference between the first and second Vt segments), Tm divg (temperature divergence measured across the surface of the device simulated), and $R_{DS(on)}$, previously defined. Using the 50% $G_m$ design, the temperature divergence across the device (Tm divg) can be reduced to almost half that of the conventional design (10.9° C. compared to 20.6° C.). However, $R_{DS(on)}$ increases significantly (35% from 31.7 mOhms to 43.0 mOhms). Using the dual Vt design with a low $\Delta Vt$, a slight decrease in temperature divergence is achieved with respect to the conventional design (16.7° C. compared to 20.6° C.). However, the increase in $R_{DS(on)}$ is negligible (<5% from 31.7 mOhms to 32.2 mOhms). Using the dual Vt design with a high $\Delta Vt$, a significant decrease in temperature divergence is achieved with respect to the conventional design (11.2° C. compared to 20.6° C.). However, the increase in $R_{DS(on)}$ is also negligible (<5% from 31.7 mOhms to 33.2 mOhms). On higher voltage devices, the $R_{DS(on)}\%$ increase will be even lower. Therefore, FBSOA can be improved with a negligible impact on $R_{DS(on)}$.

FIG. 35 is a table 3500 of simulation results showing improvement in FBSOA according to embodiments. Table 3500 shows the increased Vt on one side of a power device, Vt2, the decreased Vt on the other side of the power device, Vt1, as well as the net threshold voltage $\Delta Vt$. The temperature divergence (Tm divg) and the drain source on resistance ($R_{DS(on)}$) is also shown. In addition to the previously shown categories, table 3500 also shows the category "Imp angle", which is the implant angle for the angled source implant at a given implant energy. Increasing the implant angle provides a higher $\Delta Vt$ and hence a lower temperature divergence. At 20 keV, an angle of ~20° gives ~2× reduction in temperature divergence (11.5° C. compared to 21.7° C.) At higher energy (50 keV), a lower angle (10°) is sufficient to give a similar $\Delta Vt$. Therefore, if a higher angle is not possible due to tool restrictions, a higher energy can be used, although a lower energy with higher implant angle is desirable due to other engineering tradeoffs. The angled implant method is fully compatible with existing process steps and can use the same masks and the same process flow, in an embodiment. The angled implant method described herein improves FBSOA with negligible impact on $R_{DS(on)}$.

In another embodiment, a thicker implant mask may be used, which allows the use of a lower implant angle. The lateral shift 2207 caused by h*tan($\phi$), wherein his the height of the implant mask and $\phi$ is the implant angle, best seen in FIG. 22, provides the desired $\Delta Vt$. Thus, either the implant angle or the mask height h, or both, can be modified.

FBSOA simulations were performed with different designs. The conventional design (identical Vt segments) is used as a control. A single-side source design is used to give 50% $G_m$. The single-side design has low Tm divergence (and good FBSOA), but $R_{DS(on)}$ is high. The dual Vt with 50% low Vt area having two different $\Delta Vt$ values are simulated. Even a small $\Delta Vt$ of 0.34V improves temperature divergence. With a 0.59V $\Delta Vt$, the temperature divergence is slightly better than the 50% $G_m$ case. A simple change of source implant angle gives dual Vt segments. With just 15° angle, a 0.9V $\Delta Vt$ and low Tm divergence can be achieved, resulting in an improved FBSOA. Dual Vt designs have similar $R_{DS(on)}$ to the control device and much lower than 50% $G_m$ case. Therefore, there is little or no $R_{DS(on)}$ penalty, only an improvement in FBSOA.

FIG. 36 is a table 3600 of experimental results showing improvement in FBSOA according to embodiments. The angled implant method is compared to a conventional vertical implant in an experiment on 100V P-channel MOSFETs. In the example of table 3600 an implant energy of 20 KeV, and an implant angle of 15° is used. The conventional device has an $R_{DS(on)}$ of 48 mOhm, an FBSOA drain current range of 2.7 to 3.3 Amperes, and an FBSOA average drain current of 2.92. The angled implant device also has an $R_{DS(on)}$ of 48 mOhm, an FBSOA drain current range of 3.7 to 4.0 Amperes, and an FBSOA average drain current of 3.79. Measured results show that the dual Vt using angled implant method has 30% higher FBSOA (3.79 Amperes average drain current for the angled embodiment compared to 2.92 Amperes average drain current for the conventional design). The angled implant method provides a lower FBSOA variation with no increase in $R_{DS(on)}$ (48 mOhm).

Figure 37:
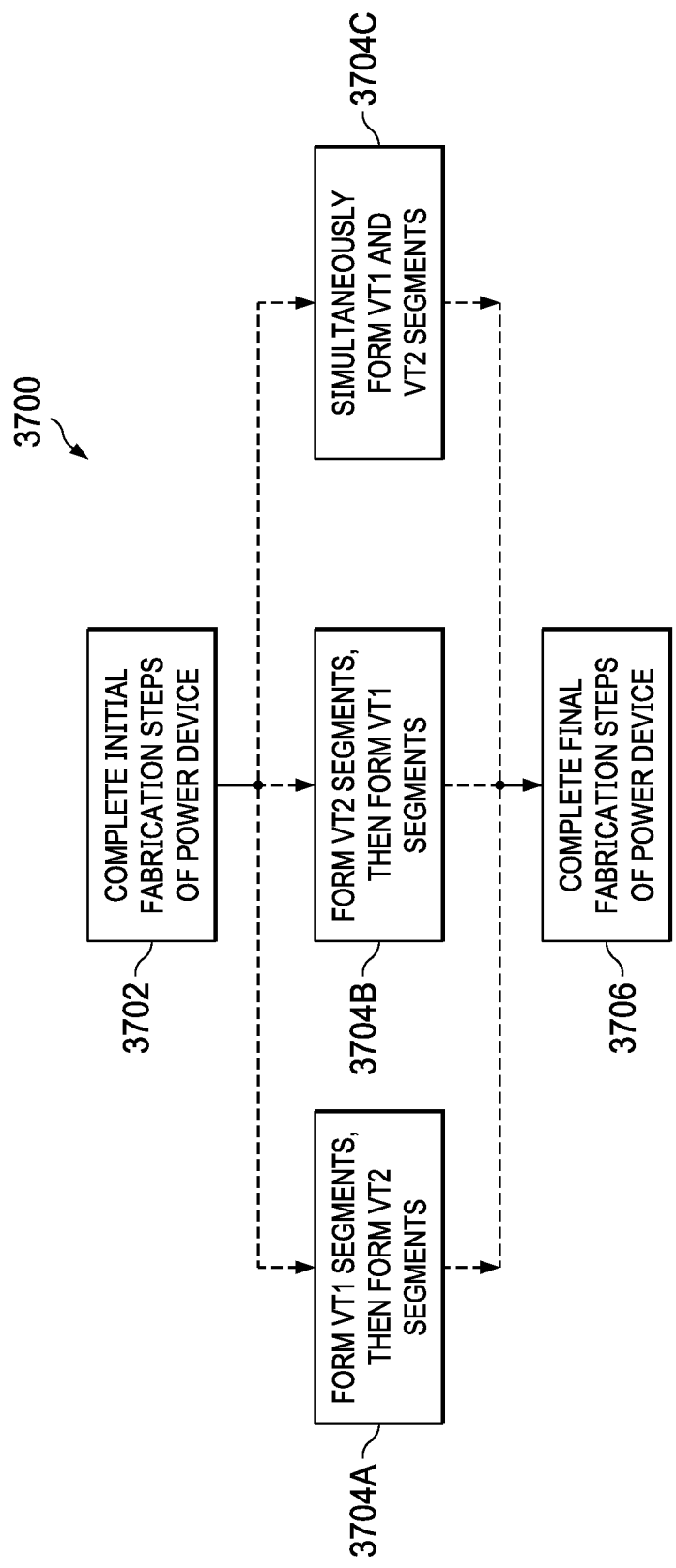
FIG. 37 is a flow chart of a generalized method of forming a device having first and second Vt segments for improving FBSOA.

FIG. 37 is a flow chart 3700 of a generalized method of forming a device having first and second Vt segments for improving FBSOA. At a first step 3702, all of the initial fabrication steps of a power device are completed before any of the Vt segments are fabricated. The method may then continue using any of three different second steps. In second step 3704A, the first Vt segments (Vt1 having a lower threshold voltage in the example of FIG. 37) are formed, and then, thereafter, the second Vt segments (Vt2 having a higher threshold voltage in the example of FIG. 37) are fully formed. In second step 3704B, the second Vt segments Vt2 are formed, and then, thereafter, the first Vt segments Vt1 are fully formed. Examples of sequential formation of the Vt segments were previously described with respect to the embodiments of FIGS. 24A-25B and FIGS. 27A-30B. In second step 3704C, the first and second Vt segments Vt1 and Vt2 are simultaneously formed. In an example, the Vt segments can be simultaneously formed using the angled implant embodiment previously described and shown in FIG. 23A. Finally, all of the final fabrication steps for the power device are completed in third step 3706 common to all devices. In an example, where the source segments and the Vt segments are substantially the same, all of the device fabrication steps are completed in step 3702. In step 3704A, 3704B, or 3704C, the source segments are formed to have different threshold voltages so that FBSOA can be improved. Finally, all of the post-source segment fabrication steps are completed at step 3706.

The methods for providing the Vt segments described herein improve the FBSOA of corresponding power devices without increasing R or generating other engineering on)

tradeoffs. Multiple Vt segments are used to achieve both acceptable values of FBSOA and acceptable values of $R_{DS(on)}$. The area ratios of multiple Vt segments can be varied to fine tune FBSOA. The dual (or multiple) Vt segments can be achieved using various methods as described herein, according to embodiments. The Vt segments are ideally uniformly distributed with small repeat distances for uniform temperature distribution (to avoid hot spots). A ΔVt of 10-30% is recommended for an optimum tradeoff of FBSOA and $R_{DS(on)}$. Values outside of this range can also be used in certain applications if desired, with good results. Many of the FBSOA improvement techniques described herein can be easily combined with other FBSOA improvement techniques to obtain additional benefits. For example, the angled implant techniques can be used for any of the geometrical device patterns previously disclosed and can also be combined with the radial pattern variations such as concentric circles and ovals previously described. The Vt segments described herein can comprise source segments, channel segments, or gate segments, or combinations of source segments, channel segments, or gate segments. The Vt segments can be coincident with the source segments, include the source segments, be associated with the source segments, or proximate to the source segments. The Vt segments will include at least the specific portion of the device that is adjusted to change the threshold voltage therein.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a device, the method comprising:
    forming a gate; and
    forming a segmented source proximate to the gate, wherein the segmented source comprises a plurality of first segments associated with a first threshold voltage and a plurality of second segments associated with a second threshold voltage different from the first threshold voltage, wherein at least two device characteristics associated with the plurality of first segments is different from the at least two device characteristics associated with the plurality of second segments,
    wherein the device comprises a laddered source transistor.

2. The method of claim 1, wherein changing at least one device characteristic comprises forming the plurality of first segments using an angled source and/or angled channel implant, and forming the plurality of second segments using the angled source and/or angled channel implant.

3. The method of claim 1, wherein changing at least one device characteristic comprises forming the plurality of first segments using a source spacer etch mask, and forming the plurality of second segments without using the source spacer etch mask.

4. The method of claim 1, wherein changing at least one device characteristic comprises forming a channel proximate to the plurality of first segments using a threshold voltage adjust implant, and forming a channel proximate to the plurality of second segments without using the threshold voltage adjust implant, or wherein changing the at least one device characteristic comprises using different threshold voltage implants in the plurality of first segments and the plurality of second segments.

5. The method of claim 1, wherein changing at least one device characteristic comprises forming a thick gate oxide over a channel proximate to the plurality of first segments, and forming a thin gate oxide over a channel proximate to the plurality of second segments.

6. The method of claim 1, wherein changing at least one device characteristic comprises forming a channel proximate to the plurality of first segments using a channel top-off mask, and forming a channel proximate to the plurality of second segments without using the channel top-off mask.

7. The method of claim 1, wherein changing at least one device characteristic comprises forming a channel proximate to the plurality of first segments using a first channel mask, and forming a channel proximate to the plurality of second segments using a second channel mask.

8. The method of claim 1, wherein the gate comprises a first gate portion and a second gate portion, and wherein changing at least one device characteristic comprises forming the first gate portion proximate to the plurality of first segments, forming the first gate portion with a first work function, forming the second gate portion proximate to the plurality of second segments, and forming the second gate portion with a second work function different from the first work function.

9. The method of claim 1, wherein the gate comprises a first gate portion and a second gate portion, and wherein changing at least one device characteristic comprises forming the first gate portion proximate to the plurality of first segments, forming the first gate portion with a first material, forming the second gate portion proximate to the plurality of second segments, and forming the second gate portion with a second material different from the first material.

10. The method of claim 9, wherein the first material comprises N-type polysilicon, and wherein the second material comprises P-type polysilicon.

11. The method of claim 9, wherein the first material comprises tungsten, and wherein the second material comprises molybdenum.

12. The method of claim 9, wherein the first material comprises titanium, and wherein the second material comprises polysilicon.

13. The method of claim 1, wherein changing at least one device characteristic comprises forming the plurality of first segments using an angled source implant and an angled channel implant, and forming the plurality of second segments without using the angled source implant and the angled channel implant.

14. The method of claim 1, wherein changing at least one device characteristic comprises forming the plurality of first segments using an angled source implant and a threshold voltage implant, and forming the plurality of second segments without using the angled source implant and the threshold voltage implant.

15. The method of claim 1, wherein the device comprises a transistor including segmented sources with less than 100% total available source area.

16. A method of forming a device, the method comprising forming a segmented source proximate to a gate of the device, wherein the segmented source comprises a plurality of first segments associated with a first threshold voltage and a plurality of second segments associated with a second threshold voltage different from the first threshold voltage, wherein at least two device characteristics associated with the plurality of first segments is different from the at least two device characteristics associated with the plurality of second segments, wherein the device comprises a checkered source transistor.

17. A method of forming a device, the method comprising forming a segmented source proximate to a gate of the device, wherein the segmented source comprises a plurality of first segments formed with an angled source implant and a plurality of second segments formed without the angled source implant, wherein at least two device characteristics associated with the plurality of first segments is different from the at least two device characteristics associated with the plurality of second segments, wherein the device comprises a laddered source transistor.

* * * * *